(12) United States Patent
Muramoto et al.

(10) Patent No.: US 11,322,651 B2
(45) Date of Patent: May 3, 2022

(54) LIGHT-EMITTING ELEMENT AND METHOD FOR MANUFACTURING SAME

(71) Applicant: NICHIA CORPORATION, Anan (JP)

(72) Inventors: Eiji Muramoto, Tokushima (JP); Akinori Kishi, Tokushima (JP)

(73) Assignee: NICHIA CORPORATION, Anan (JP)

(*) Notice: Subject to any disclaimer, the term of this patent is extended or adjusted under 35 U.S.C. 154(b) by 278 days.

(21) Appl. No.: 16/584,320

(22) Filed: Sep. 26, 2019

(65) Prior Publication Data

US 2020/0105971 A1  Apr. 2, 2020

(30) Foreign Application Priority Data

Sep. 27, 2018 (JP) .............. JP2018-182626

(51) Int. Cl.
*H01L 33/24* (2010.01)
*H01L 33/32* (2010.01)
(Continued)

(52) U.S. Cl.
CPC .......... *H01L 33/24* (2013.01); *H01L 33/0075* (2013.01); *H01L 33/0093* (2020.05); *H01L 33/22* (2013.01); *H01L 33/32* (2013.01); *H01L 33/38* (2013.01); *H01L 33/44* (2013.01); *H01L 33/06* (2013.01); *H01L 2933/0016* (2013.01)

(58) Field of Classification Search
CPC ..... H01L 33/0075; H01L 33/20; H01L 33/22; H01L 33/24; H01L 33/32; H01L 33/38; H01L 33/385; H01L 33/387; H01L 33/44; H01L 33/42; H01L 33/14; H01L 33/145; H01L 33/16
See application file for complete search history.

(56) References Cited

U.S. PATENT DOCUMENTS

2014/0110738 A1  4/2014  Yokobayashi et al.
2014/0319534 A1  10/2014  Miyachi et al.
(Continued)

FOREIGN PATENT DOCUMENTS

JP  2014-060294 A  4/2014
JP  2014-086574 A  5/2014
(Continued)

*Primary Examiner* — Sue A Purvis
*Assistant Examiner* — Scott Stowe
(74) *Attorney, Agent, or Firm* — Foley & Lardner LLP

(57) ABSTRACT

A light-emitting element includes a first semiconductor layer, a second semiconductor layer, a light-emitting layer, a first electrode, and a second electrode. The first semiconductor layer includes gallium and nitrogen and is of an n-type. The second semiconductor layer includes gallium and nitrogen and is of a p-type. The light-emitting layer is provided between the first semiconductor layer and the second semiconductor layer. The first electrode is electrically connected to the first semiconductor layer. The second electrode is electrically connected to the second semiconductor layer. The first semiconductor layer includes a first partial region and a first side surface region. The first partial region includes a first surface contacting the first electrode. The first side surface region includes a first side surface crossing a plane perpendicular to a first direction. The first direction is from the second semiconductor layer toward the first semiconductor layer.

18 Claims, 15 Drawing Sheets

(51) Int. Cl.
  *H01L 33/38*    (2010.01)
  *H01L 33/00*    (2010.01)
  *H01L 33/22*    (2010.01)
  *H01L 33/44*    (2010.01)
  *H01L 33/06*    (2010.01)

(56) References Cited

U.S. PATENT DOCUMENTS

2015/0228862 A1    8/2015  Miyoshi et al.
2016/0064603 A1    3/2016  Lin et al.
2017/0077353 A1*   3/2017  Kim ................. H01L 33/42

FOREIGN PATENT DOCUMENTS

| JP | 2014-216470 A | 11/2014 |
| JP | 2016-046511 A | 4/2016 |
| JP | 2017-069282 A | 4/2017 |

* cited by examiner

LIGHT-EMITTING ELEMENT AND METHOD FOR MANUFACTURING SAME

CROSS-REFERENCE TO RELATED APPLICATIONS

This application claims priority to Japanese Patent Application No. 2018-182626, filed on Sep. 27, 2018, the entire contents of which are incorporated herein by reference.

FIELD

Embodiments described herein relate generally to a light-emitting element and a method for manufacturing the same.

BACKGROUND

Japanese Patent Publication No. 2017-69282 describes a light-emitting element in which a semiconductor layer of a first conductivity type and a semiconductor layer of a second conductivity type are formed on a substrate, and a first electrode and a second electrode are provided in contact with the respective semiconductor layers. Stable electrical characteristics are desirable in such a light-emitting element.

SUMMARY

According to one embodiment, a light-emitting element includes a first semiconductor layer including gallium and nitrogen and being of an n-type, a second semiconductor layer including gallium and nitrogen and being of a p-type, a light-emitting layer provided between the first semiconductor layer and the second semiconductor layer, a first electrode electrically connected to the first semiconductor layer, and a second electrode electrically connected to the second semiconductor layer. The first semiconductor layer includes a first partial region and a first side surface region. The first partial region includes a first surface contacting the first electrode. The first side surface region includes a first side surface crossing a plane perpendicular to a first direction. The first direction is from the second semiconductor layer toward the first semiconductor layer. The first partial region includes a bond of gallium and nitrogen, and the first side surface region does not include the bond of gallium and nitrogen, or the first partial region does not include a bond of gallium and oxygen, and the first side surface region includes the bond of gallium and oxygen, or a second ratio is higher than a first ratio. The first ratio is a ratio of a first peak intensity to a second peak intensity. The first peak intensity corresponds to the bond of gallium and oxygen in the first partial region in X-ray photoelectron spectroscopy. The second peak intensity corresponds to the bond of gallium and nitrogen in the first partial region in the X-ray photoelectron spectroscopy. The second ratio is a ratio of a third peak intensity to a fourth peak intensity. The third peak intensity corresponds to the bond of gallium and oxygen in the first side surface region in the X-ray photoelectron spectroscopy. The fourth peak intensity corresponds to the bond of gallium and nitrogen in the first side surface region in the X-ray photoelectron spectroscopy.

According to another embodiment, a method for manufacturing a light-emitting element includes: preparing a semiconductor stacked body, the semiconductor stacked body including a first semiconductor layer, a second semiconductor layer, and a light-emitting layer provided between the first semiconductor layer and the second semiconductor layer, the first semiconductor layer including gallium and nitrogen and being of an n-type, the second semiconductor layer including gallium and nitrogen and being of a p-type; a first exposing at least a side surface of the first semiconductor layer by removing a portion of the first semiconductor layer, a portion of the second semiconductor layer, and a portion of the light-emitting layer; and a first introducing oxygen to a portion of the semiconductor stacked body including the side surface by processing, in an atmosphere including oxygen, the semiconductor stacked body after the first exposing.

DETAILED DESCRIPTION

Figure 1:
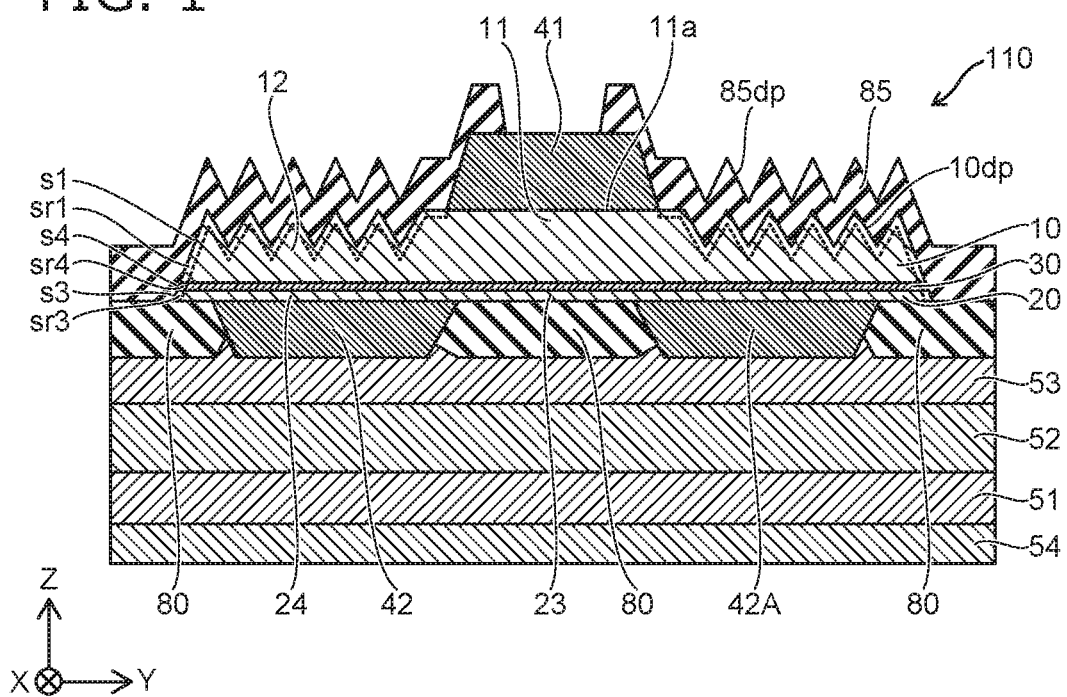
FIG. 1 is a schematic cross-sectional view illustrating a light-emitting element according to a first embodiment.

Various embodiments are described below with reference to the accompanying drawings.

The drawings are schematic and conceptual, and the relationships between the thickness and width of portions, the proportions of sizes among portions, etc. are not necessarily the same as the actual values. The dimensions and proportions may be illustrated differently among drawings, even for identical portions.

In the specification and drawings, components similar to those described previously or illustrated in a previous drawing are marked with like reference numerals, and a detailed description is omitted as appropriate.

First Embodiment

FIG. 1 is a schematic cross-sectional view illustrating a light-emitting element according to a first embodiment.

As shown in FIG. 1, the light-emitting element 110 according to the first embodiment includes a first semiconductor layer 10, a second semiconductor layer 20, a light-emitting layer 30, a first electrode 41, and a second electrode 42.

The first semiconductor layer 10 and the second semiconductor layer 20 include gallium and nitrogen. The first semiconductor layer 10 is of an n-type. The second semiconductor layer 20 is of a p-type. The first semiconductor layer 10 includes, for example, at least one of Si, Ge, Te, or Sn as an n-type impurity. The second semiconductor layer 20 includes, for example, at least one of Mg, Zn, or C as a p-type impurity.

The light-emitting layer 30 is provided between the first semiconductor layer 10 and the second semiconductor layer 20.

The light-emitting layer 30 includes, for example, a well layer and a barrier layer. In one example, the first semiconductor layer 10 and the second semiconductor layer 20 include GaN. In such a case, the well layer includes InGaN. In such a case, the barrier layer includes GaN or AlGaN.

The first semiconductor layer 10 and the second semiconductor layer 20 may include AlGaN. In such a case, the well layer includes GaN or InGaN. In such a case, the barrier layer includes AlGaN.

The first electrode 41 is electrically connected to the first semiconductor layer 10. The first electrode 41 includes, for example, a stacked film of Au/Pt/Ti. The second electrode 42 is electrically connected to the second semiconductor layer 20. The second electrode 42 includes, for example, at least one selected from the group consisting of Ag and Al.

A first direction from the second semiconductor layer 20 toward the first semiconductor layer 10 is taken as a Z-axis direction. One direction perpendicular to the Z-axis direction is taken as an X-axis direction. A direction perpendicular to the Z-axis direction and the X-axis direction is taken as a Y-axis direction.

The first semiconductor layer 10, the second semiconductor layer 20, and the light-emitting layer 30 extend along the X-Y plane.

In the example, a portion of the first semiconductor layer 10, a portion of the light-emitting layer 30, and a portion of the second semiconductor layer 20 are provided between the first electrode 41 and the second electrode 42. The first semiconductor layer 10, the light-emitting layer 30, and the second semiconductor layer 20 are provided in this order from the side where the first electrode 41 is provided toward the side where the second electrode 42 is provided.

For example, the first electrode 41 is provided at the upper surface of the first semiconductor layer 10. For example, the second electrode 42 is provided at the lower surface of the second semiconductor layer 20.

For example, the first semiconductor layer 10 includes a first partial region 11 and a second partial region 12. The direction from the second partial region 12 toward the first partial region 11 crosses the first direction (the Z-axis direction). The second semiconductor layer 20 includes a third partial region 23 and a fourth partial region 24 in the X-Y plane. The first partial region 11 is provided between the third partial region 23 and the first electrode 41 in the first direction (the Z-axis direction). The fourth partial region 24 is provided between the second electrode 42 and the second partial region 12 in the first direction (the Z-axis direction).

An electrode 42A is provided in the example. The electrode 42A is electrically connected to the second semiconductor layer 20. For example, the electrode 42A is continuous with the second electrode 42. The electrode 42A may correspond to a portion of the second electrode 42. For example, the material of the electrode 42A is the same as the material of the second electrode 42.

In the example, the light-emitting element 110 further includes a conductive portion 51 and an insulating portion 80. The conductive portion 51 is electrically connected to the second electrode 42 (and the electrode 42A). The conductive portion 51 is, for example, a base body. For example, the conductive portion 51 supports the second semiconductor layer 20, the light-emitting layer 30, and the first semiconductor layer 10. The conductive portion 51 is, for example, a support body. In one example, the conductive portion 51 is a silicon substrate.

For example, the first partial region 11 is provided between the conductive portion 51 and the first electrode 41 in the first direction (the Z-axis direction). The third partial region 23 is provided between the conductive portion 51 and the first partial region 11 in the first direction. The insulating portion 80 is provided between the conductive portion 51 and the third partial region 23 in the first direction.

For example, the fourth partial region 24 is provided between the conductive portion 51 and the second partial region 12 in the first direction (the Z-axis direction). The second electrode 42 is provided between the conductive portion 51 and the fourth partial region 24 in the first direction.

In the example, a conductive layer 52 and a conductive layer 53 are provided in the light-emitting element 110. The conductive layer 52 is between the conductive portion 51 and the second electrode 42. The conductive layer 53 is between the conductive layer 52 and the second electrode 42. The conductive layer 52 and the conductive layer 53 are, for example, bonding layers. The conductive layer 52 and the conductive layer 53 include, for example, solder, etc. For example, the conductive layer 53 is provided at the lower surface of the second electrode 42. For example, the conductive layer 52 is provided at the upper surface of the conductive portion 51. The second electrode 42 and the conductive portion 51 are bonded by these conductive layers.

In the example, an electrode 54 is further provided on the surface of the conductive portion 51. The conductive portion 51 is between the electrode 54 and the conductive layer 52. The electrode 54 includes, for example, at least one selected from the group consisting of Pt and Ti.

For example, a voltage is applied between the first electrode 41 and the electrode 54. A current is supplied to the light-emitting layer 30 via the first semiconductor layer 10 and the second semiconductor layer 20. Light is emitted from the light-emitting layer 30.

In the example, the light that is emitted from the light-emitting layer 30 passes through the first semiconductor layer 10 and is emitted upward. For example, a portion of the light is blocked by the first electrode 41. Light emission under the first electrode 41 is suppressed by providing the insulating portion 80 under the first electrode 41. A high light extraction efficiency is obtained easily because the current can be diffused to the regions other than under the first electrode 41 while reducing the blockage of the light by the first electrode 41.

In the example, an unevenness 10dp is provided in the light extraction surface (the upper surface) of the first semiconductor layer 10. A high light extraction efficiency is obtained due to the unevenness 10dp.

An insulating layer 85 is provided in the example. The first semiconductor layer 10, the second semiconductor layer 20, and the light-emitting layer 30 are provided between the conductive portion 51 and at least a portion of the insulating layer 85. For example, the insulating layer 85 covers the side surfaces of the first semiconductor layer 10, the second semiconductor layer 20, and the light-emitting layer 30. The insulating portion 80 and the insulating layer 85 are in contact at the outer edge portion of the light-emitting element 110. The first semiconductor layer 10, the second semiconductor layer 20, and the light-emitting layer 30 are protected by the insulating portion 80 and the insulating layer 85. The insulating portion 80 and the insulating layer 85 include, for example, silicon oxide.

In the example, the surface (the upper surface) of the insulating layer 85 includes an unevenness 85dp. The unevenness 85dp has a configuration conforming to the unevenness 10dp in the thickness direction of the semiconductor stacked body.

As described above, the first semiconductor layer 10 includes the first partial region 11. The first partial region 11 includes a first surface 11a contacting the first electrode 41. The first semiconductor layer 10 further includes a first side surface region sr1. The first side surface region sr1 includes a first side surface s1. The first side surface s1 crosses a plane (the X-Y plane) perpendicular to the first direction (the Z-axis direction). For example, the first partial region 11 does not include the first side surface s1. For example, the first side surface region sr1 does not include the first surface 11a.

In the first embodiment, for example, the concentration of oxygen included in the first side surface region sr1 is higher than in the first partial region 11. For example, the first side surface region sr1 includes oxygen; and the first partial region 11 does not include oxygen. For example, in the case in which both the first side surface region sr1 and the first partial region 11 include oxygen, the concentration of oxygen included in the first side surface region sr1 is higher than the concentration of oxygen included in the first partial region 11.

In one example (a first example), the first partial region 11 includes a bond of gallium and nitrogen, and the first side surface region sr1 does not include the bond of gallium and nitrogen. In another example (a second example), the first partial region 11 does not include a bond of gallium and oxygen, and the first side surface region sr1 includes the bond of gallium and oxygen. Further, in another example (a third example), the ratio of the amount of the bond of gallium and oxygen to the amount of the bond of gallium and nitrogen is different between the first partial region 11 and the first side surface region sr1. The third example is described below. For example, the information relating to these bonds is obtained by XPS (X-ray photoelectron spectroscopy) analysis, etc.

For example, it is considered that the electrical resistance of the semiconductor layers (e.g., GaN) becomes high when the semiconductor layers include oxygen. For example, the leakage current at the side surfaces of the semiconductor layers is suppressed by the side surfaces of the semiconductor layers having a high electrical resistance.

In the first embodiment as described below, the first semiconductor layer 10 may include a second side surface region. The second side surface region is described below.

In the first embodiment, the concentration of the bond of gallium and oxygen may be locally high in the side surface region of the second semiconductor layer 20 and the side surface region of the light-emitting layer 30. For example, as shown in FIG. 1, the second semiconductor layer 20 includes a third side surface region sr3. The third side surface region sr3 includes a third side surface s3 of the second semiconductor layer 20. The third side surface s3 crosses the X-Y plane. As shown in FIG. 1, the light-emitting layer 30 includes a fourth side surface region sr4. The fourth side surface region sr4 includes a fourth side surface s4 of the light-emitting layer 30. The fourth side surface s4 crosses the X-Y plane.

Examples of the states of the bonds in the regions recited above (the first partial region 11, the first side surface region sr1, the third side surface region sr3, the fourth side surface region sr4, etc.) will now be described.

FIG. 2A to FIG. 2D are graphs illustrating the light-emitting element according to the first embodiment.

Figure 2A:
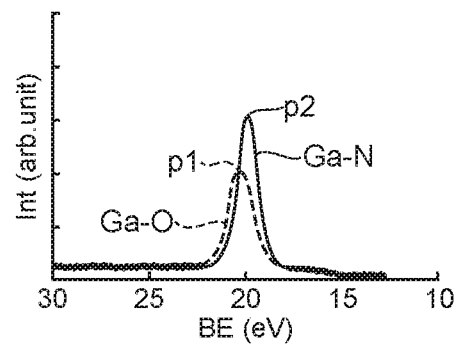
FIG. 2A is a graph illustrating the light-emitting element according to the first embodiment.
Figure 2B:
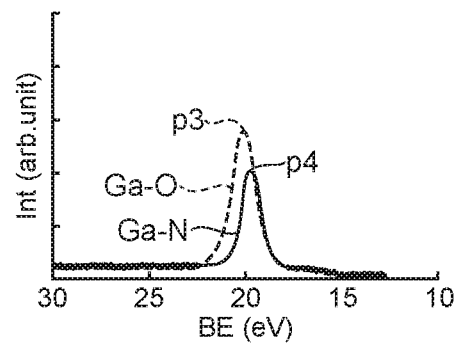
FIG. 2B is a graph illustrating the light-emitting element according to the first embodiment.
Figure 2C:
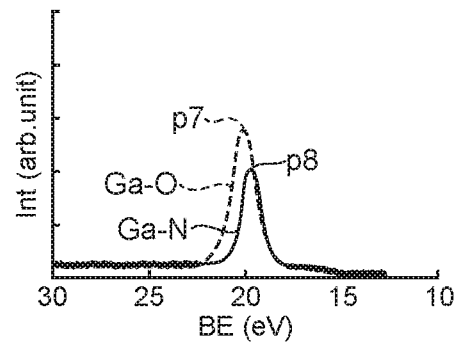
FIG. 2C is a graph illustrating the light-emitting element according to the first embodiment.
Figure 2D:
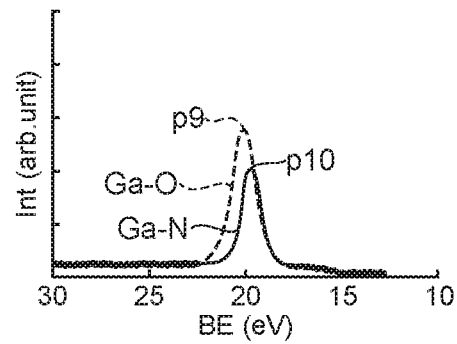
FIG. 2D is a graph illustrating the light-emitting element according to the first embodiment.

These figures illustrate signals obtained by X-ray photoelectron spectroscopy of regions of the semiconductor layers. FIG. 2A corresponds to the first partial region 11. FIG. 2B corresponds to the first side surface region sr1. FIG. 2C corresponds to the third side surface region sr3. FIG. 2D corresponds to the fourth side surface region sr4. In these figures, the horizontal axis is a binding energy BE (eV). The vertical axis is a signal intensity Int (arbitrary units). These figures illustrate the results of peak fitting by X-ray photoelectron spectroscopy of the spectra obtained by measuring the Ga 3d-spectrum for the 3d-spectrum predicted for the bond between Ga and nitrogen (the Ga—N bond) and the 3d-spectrum predicted for the bond between Ga and oxygen (Ga—O). In these figures, the solid line corresponds to the bond between Ga and nitrogen (the Ga—N bond). The broken line corresponds to the bond between Ga and oxygen (the Ga—O bond).

In the example as shown in FIG. 2A, in the first partial region 11, the peak intensity (a first peak intensity p1) of the Ga—O bond is lower than the peak intensity (a second peak intensity p2) of the Ga—N bond.

In the example as shown in FIG. 2B, in the first side surface region sr1, the peak intensity (a third peak intensity p3) of the Ga—O bond is higher than the peak intensity (a fourth peak intensity p4) of the Ga—N bond.

Here, the ratio (p1/p2) of the first peak intensity p1 corresponding to the bond of gallium and oxygen in the first partial region 11 in the X-ray photoelectron spectroscopy to the second peak intensity p2 corresponding to the bond of gallium and nitrogen in the first partial region 11 in the X-ray photoelectron spectroscopy is taken as a first ratio. In the example of FIG. 2A, the first ratio is less than 1.

The ratio (p3/p4) of the third peak intensity p3 corresponding to the bond of gallium and oxygen in the first side surface region sr1 in the X-ray photoelectron spectroscopy to the fourth peak intensity p4 corresponding to the bond of gallium and nitrogen in the first side surface region sr1 in the X-ray photoelectron spectroscopy is taken as a second ratio. In the example of FIG. 2B, the second ratio exceeds 1. The second ratio may be 1 or more.

In the first embodiment, the second ratio (p3/p4) is higher than the first ratio (p1/p2). Because the second ratio in the first side surface region sr1 is high, for example, the electrical resistance in the first side surface region sr1 of the first semiconductor layer 10 is higher than that of the other portions (e.g., the first partial region 11). For example, the leakage current via the first side surface s1 can be suppressed. Thereby, for example, the reliability can be higher.

In the first side surface region sr1, for example, the amount of the bond of gallium and oxygen is more than the amount of the bond of gallium and nitrogen. As described below, for example, such a configuration is obtained by performing processing of the first side surface region sr1 in an atmosphere including oxygen.

The depth (e.g., the length along a direction perpendicular to the first side surface s1) of the first side surface region sr1 is, for example, not less than 0.2 nm and not more than 10 nm. For example, by processing such as that recited above, the amount of the bond of gallium and oxygen can be set to be more than the amount of the bond of gallium and nitrogen in a region having a depth of 10 nm or less.

For example, the semiconductor layers (GaN-based) are divided into regions corresponding to the light-emitting elements in the manufacturing processes of the light-emitting element, and end portions (separated-element ends) of the semiconductor layers are formed. It was found that a micro leakage current occurs at the end portions. For example, a leakage current occurs easily at the interface between the protective layer (e.g., the insulating layer 85) and the semiconductor layers at the vicinity of the separated-element ends. For example, the leakage current is caused by the energy level formed at the surfaces of the side surfaces of the semiconductor layers. For example, it is considered that interface states are formed at the interface between the protective layer (e.g., the insulating layer 85) and the side surfaces of the semiconductor layers. For example, it is considered that the leakage current occurs in a path including the end of the first semiconductor layer 10, the end of the light-emitting layer 30, the end of the second semiconductor layer 20, and the end of the second electrode 42.

For example, there are cases in which the characteristics of the light-emitting element degrade due to operating for a long period of time. For example, there are also cases in which breakdown of the light-emitting element occurs due to operating for a long period of time. It is considered that such breakdown or degradation of the characteristics is due to the alteration of the end portions of the semiconductor layers. It is considered that the alteration of the semiconductor layers when operating for a long period of time is caused by penetration of water from the outside, etc. The semiconductor layers are altered easily in the case in which the protective film (e.g., the insulating layer 85) is not provided.

According to investigations by the inventor, it was found that the n-type semiconductor layer is altered particularly easily. For example, there is a possibility that the alteration of the n-type semiconductor layer is caused by light (e.g., light of a short wavelength such as ultraviolet light), a current, water in ambient air, etc. For example, there is a possibility that the alteration of the n-type semiconductor layer may be amorphization due to a reaction between the n-type semiconductor layer and water in ambient air. For example, the alteration occurs easily in the portion of the first semiconductor layer 10 proximal to the first electrode 41. Or, for example, the alteration occurs easily at the separated-element end of the first semiconductor layer 10. If the protective layer is set to be thick to suppress the alteration of the semiconductor layers, the light extraction efficiency decreases.

In the first embodiment, for example, oxygen is introduced locally to the side surface portions of the semiconductor layers (e.g., the side surfaces of the separated-element ends). For example, the interface states at the interface between the protective layer and the semiconductor layer are few at the portions where the oxygen is introduced. The leakage current is suppressed thereby. The alteration of the semiconductor layers is suppressed because the side surface portions of the semiconductor layers are oxidized. According to the first embodiment, a light-emitting element can be provided in which the electrical characteristics can be stabilized.

According to the first embodiment, in particular, the reliability can be increased further because the alteration of the n-type semiconductor layer can be suppressed. For example, a high light extraction efficiency is obtained because it is unnecessary for the protective layer (e.g., the insulating layer 85) to be thick.

In the first embodiment, the amount of the bond of gallium and oxygen may be locally high in the side surface region of the second semiconductor layer 20 (the third side surface region sr3) and the side surface region of the light-emitting layer 30 (the fourth side surface region sr4).

As shown in FIG. 2C, for example, the ratio (p7/p8) of a seventh peak intensity p7 corresponding to the bond of gallium and oxygen in the third side surface region sr3 in the X-ray photoelectron spectroscopy to an eighth peak intensity p8 corresponding to the bond of gallium and nitrogen in the third side surface region sr3 in the X-ray photoelectron spectroscopy is taken as a fourth ratio. The fourth ratio (p7/p8) is higher than the first ratio (p1/p2).

By setting the fourth ratio to be higher than the first ratio, for example, the leakage current is suppressed. For example, the alteration can be suppressed for the second semiconductor layer 20.

As shown in FIG. 2D, the ratio (p9/p10) of a ninth peak intensity p9 corresponding to the bond of gallium and oxygen in the fourth side surface region sr4 in the X-ray photoelectron spectroscopy to a tenth peak intensity p10 corresponding to the bond of gallium and nitrogen in the fourth side surface region sr4 in the X-ray photoelectron spectroscopy is taken as a fifth ratio. The fifth ratio (p9/p10) is higher than the first ratio (p1/p2).

By setting the fifth ratio higher than the first ratio, for example, the leakage current is suppressed. For example, the alteration can be suppressed for the light-emitting layer 30.

An example of a method for manufacturing the light-emitting element 110 will now be described.

FIG. 3A to FIG. 3E and FIG. 4A to FIG. 4D are schematic cross-sectional views illustrating the method for manufacturing the light-emitting element according to the first embodiment.

Figure 3A:
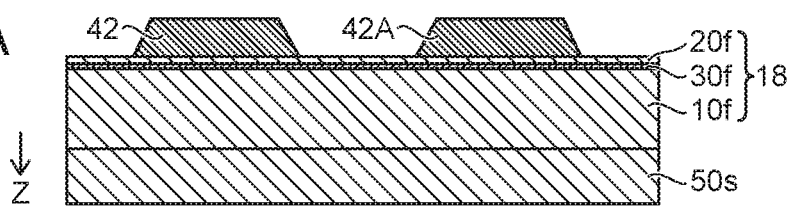
FIG. 3A is a schematic cross-sectional view illustrating a method for manufacturing the light-emitting element according to the first embodiment.

A semiconductor stacked body 18 is prepared as shown in FIG. 3A. The semiconductor stacked body 18 includes a first semiconductor film 10$f$ of the n-type, a second semiconductor film 20$f$ of the p-type, and a light-emitting film 30$f$. The first semiconductor film 10$f$ includes gallium and nitrogen. The second semiconductor film 20$f$ includes gallium and nitrogen. The light-emitting film 30$f$ is provided between the first semiconductor film 10$f$ and the second semiconductor film 20$f$.

For example, the semiconductor stacked body 18 is epitaxially grown on a growth substrate 50$s$. For example, the substrate 50$s$ is made of sapphire. For example, the first semiconductor film 10$f$ is formed on the substrate 50$s$, the light-emitting film 30$f$ is formed on the first semiconductor film 10$f$, and the second semiconductor film 20$f$ is formed on the light-emitting film 30$f$. The first semiconductor film 10$f$ is used to form the first semiconductor layer 10. The second semiconductor film 20$f$ is used to form the second semiconductor layer 20. The light-emitting film 30$f$ is used to form the light-emitting layer 30. The second electrode 42 (and the electrode 42A) are formed on the second semiconductor film 20$f$.

Figure 3B:
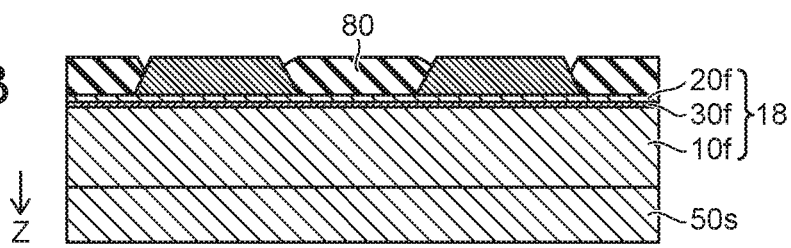
FIG. 3B is a schematic cross-sectional view illustrating the method for manufacturing the light-emitting element according to the first embodiment.

As shown in FIG. 3B, the insulating portion 80 is formed on the upper surface of the second semiconductor film 20$f$ where the second electrode 42 and the electrode 42A are not provided. The insulating portion 80 covers portions of the second electrode 42 and the electrode 42A.

Figure 3C:
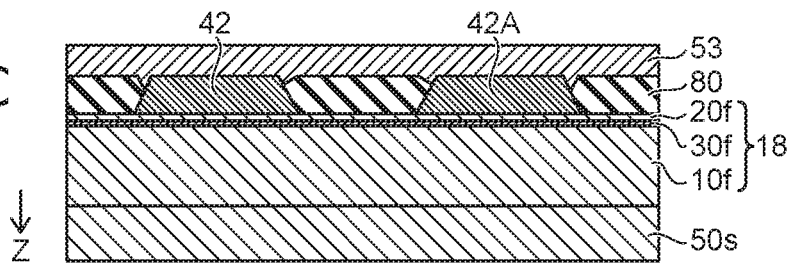
FIG. 3C is a schematic cross-sectional view illustrating the method for manufacturing the light-emitting element according to the first embodiment.

As shown in FIG. 3C, the conductive layer 53 (e.g., a bonding layer) that continuously covers the insulating portion 80, the second electrode 42, and the electrode 42A from above is formed.

Figure 3D:
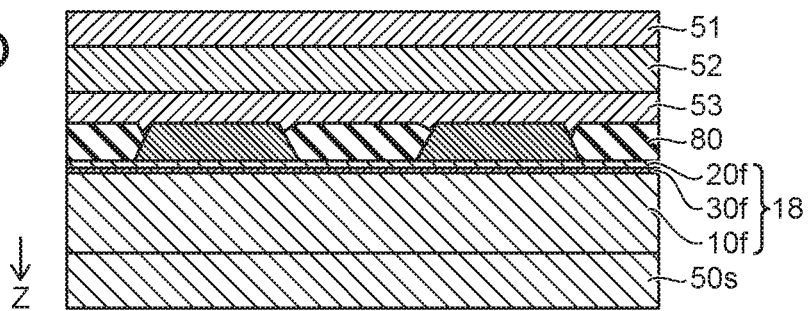
FIG. 3D is a schematic cross-sectional view illustrating the method for manufacturing the light-emitting element according to the first embodiment.

As shown in FIG. 3D, the conductive portion 51 on which the conductive layer 52 (e.g., a bonding layer) is provided is prepared. The conductive layer 52 and the conductive layer 53 are bonded.

Figure 3E:
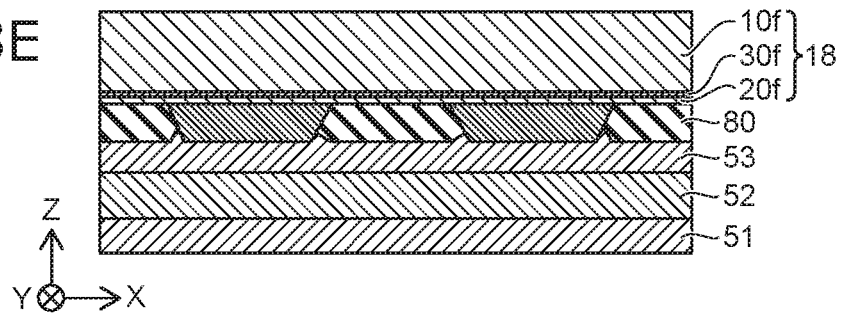
FIG. 3E is a schematic cross-sectional view illustrating the method for manufacturing the light-emitting element according to the first embodiment.

As shown in FIG. 3E, the growth substrate 50$s$ is removed. For example, the surface of the first semiconductor film 10$f$ is exposed. For example, the removal of the substrate 50$s$ is performed by at least one of laser light irradiation, etching, or polishing.

Figure 4A:
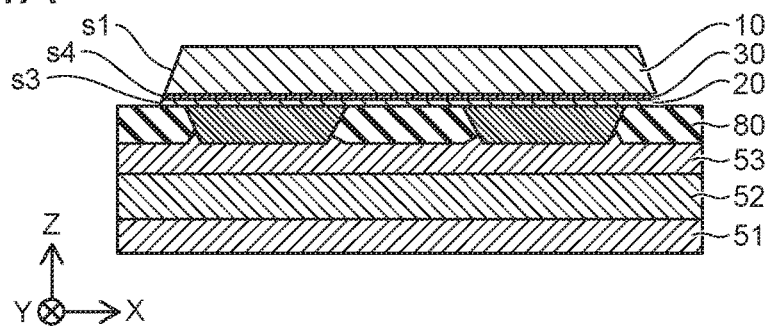
FIG. 4A is a schematic cross-sectional view illustrating the method for manufacturing the light-emitting element according to the first embodiment.

As shown in FIG. 4A, a portion of the semiconductor stacked body 18 (the first semiconductor film 10$f$, the second semiconductor film 20$f$, and the light-emitting film 30$f$) is removed (a first removal process). For example, the removal of the semiconductor stacked body 18 is performed by RIE (Reactive Ion Etching). Element separation is performed thereby. In the first removal process, a portion of the first semiconductor film 10$f$, a portion of the second semiconductor film 20$f$, and a portion of the light-emitting film 30$f$ are removed. Thereby, the first semiconductor layer 10 is obtained from the first semiconductor film 10$f$, the second semiconductor layer 20 is obtained from the second semiconductor film 20$f$, and the light-emitting layer 30 is obtained from the light-emitting film 30$f$. At least the side surface (the first side surface s1) of the first semiconductor layer 10 is exposed. For example, the side surface (the fourth side surface s4) of the light-emitting layer 30 and the side surface (the third side surface s3) of the second semiconductor layer 20 are exposed.

Figure 4B:
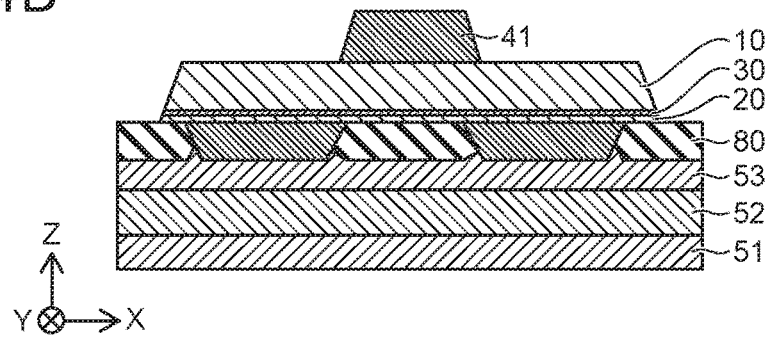
FIG. 4B is a schematic cross-sectional view illustrating the method for manufacturing the light-emitting element according to the first embodiment.

As shown in FIG. 4B, the first electrode 41 is formed on the first semiconductor layer 10.

Figure 4C:
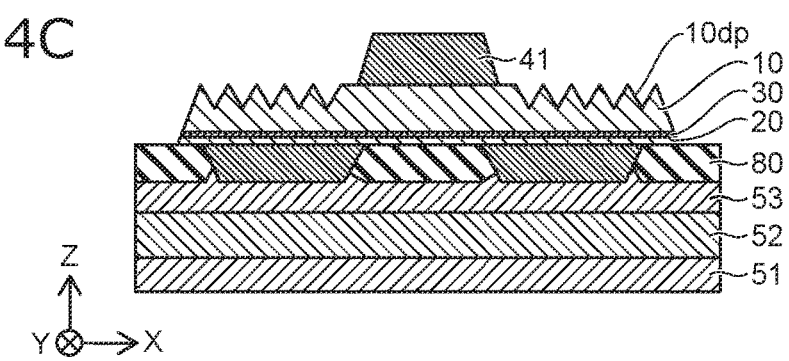
FIG. 4C is a schematic cross-sectional view illustrating the method for manufacturing the light-emitting element according to the first embodiment.

As shown in FIG. 4C, the unevenness 10$dp$ is formed in the surface of the first semiconductor layer 10. For example, the formation of the unevenness 10$dp$ is performed by at least one of wet etching or dry etching.

Figure 4D:
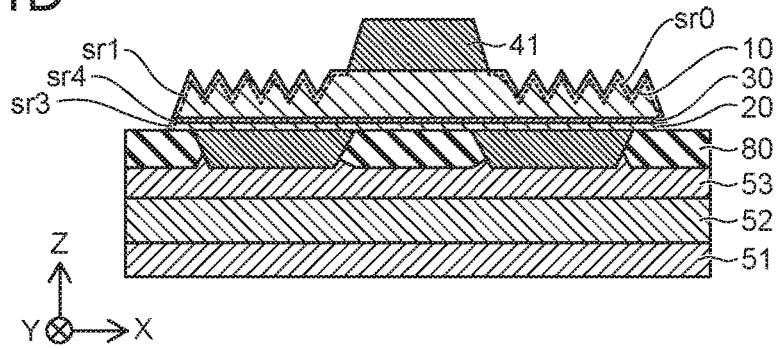
FIG. 4D is a schematic cross-sectional view illustrating the method for manufacturing the light-emitting element according to the first embodiment.

As shown in FIG. 4D, the first semiconductor layer 10, the second semiconductor layer 20, and the light-emitting layer 30 after the first removal process are processed in an atmosphere including oxygen (a first processing process). For example, plasma processing in an atmosphere including oxygen is performed. It is favorable for a bias power to be supplied to the plasma processing. Thereby, oxygen is introduced easily to the surface portions of the first semiconductor layer 10, the second semiconductor layer 20, and the light-emitting layer 30 after the first removal process.

By the first processing process, oxygen is introduced to a surface portion sr0 of the first semiconductor layer 10, the second semiconductor layer 20, and the light-emitting layer 30 after the first removal process. For example, oxygen is introduced to at least the portion including the exposed side surface (the first side surface s1 of the first semiconductor layer 10). The first side surface region sr1 that includes the bond of gallium and oxygen is formed thereby. For example, oxygen may be introduced to the portion including the third side surface s3 of the second semiconductor layer 20. The third side surface region sr3 that includes the bond of gallium and oxygen is formed thereby. For example, oxygen may be introduced to the portion including the fourth side surface s4 of the light-emitting layer 30. The fourth side surface region sr4 that includes the bond of gallium and oxygen is formed thereby.

Subsequently, as necessary, the insulating layer 85 that covers the surfaces of the first semiconductor layer 10, the second semiconductor layer 20, and the light-emitting layer 30 is formed. The electrode 54 is formed at the lower surface of the conductive portion 51. The light-emitting element 110 is obtained thereby.

In the case in which the diameter of the electrode of the processing apparatus in the first processing process recited above is about 240 mm, it is favorable for the bias power to be 50 W or more. It is favorable for the partial pressure of oxygen in the atmosphere including oxygen in the first processing process to be not less than 0.5 Pa and not more than 50 Pa (e.g., about 8 Pa).

In the first embodiment, oxygen is introduced to the side surfaces of the first semiconductor layer 10, the second semiconductor layer 20, and the light-emitting layer 30. Thereby, the penetration of water, etc., from the side surfaces of the first semiconductor layer 10, the second semiconductor layer 20, and the light-emitting layer 30 after the first removal process is suppressed. For example, the alteration of the semiconductor stacked body 18 can be suppressed even when the insulating layer 85 is set to be thin; therefore, the insulating layer 85 can be thin, and the light extraction efficiency can be increased.

An example of experimental results relating to the light-emitting element 110 will now be described.

Figure 5A:
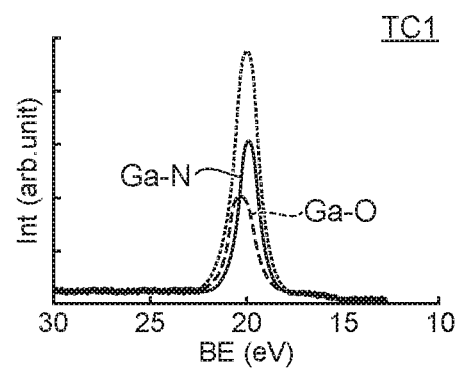
FIG. 5A is a graph illustrating experimental results relating to the light-emitting element.
Figure 5B:
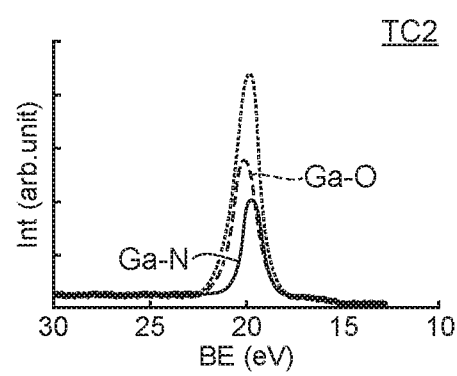
FIG. 5B is a graph illustrating experimental results relating to the light-emitting element.
Figure 5C:
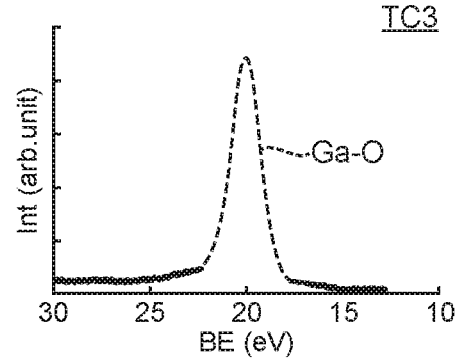
FIG. 5C is a graph illustrating experimental results relating to the light-emitting element.

FIG. 5A to FIG. 5C are graphs illustrating experimental results relating to the light-emitting element.

These figures illustrate XPS analysis results of samples of three types of conditions. The analysis conditions of the X-ray photoelectron spectroscopy are as follows. The apparatus that is used is a Quantera II Scanning X-ray Micro Probe. The X-ray source is monochromatized AlKα-ray (h v being 1486.6 eV). The analysis area is a circle having a diameter of 200 μm. The pulse energy is 55 eV. Processing of an n-type semiconductor layer (a GaN layer) is performed for these samples. FIG. 5A to FIG. 5C correspond to first to third conditions TC1 to TC3, respectively. Plasma processing is not performed for the first condition TC1. Plasma processing is performed for the second condition TC2 and the third condition TC3. For the second condition TC2, the bias power is 0 W, the ICP (Inductively Coupled Plasma) power is 400 W, the flow rate of the oxygen gas is 100 sccm, the partial pressure of the oxygen gas is 8 Pa, and the processing time is 60 seconds. For the third condition TC3, the bias power is 200 W. Other than the bias power, the third condition TC3 is similar to the second condition TC2. In FIG. 5A to FIG. 5C, the horizontal axis is the binding energy BE (eV). The vertical axis is the signal intensity Int (arbitrary units). These figures illustrate the results of peak fitting by X-ray photoelectron spectroscopy of the spectra obtained by measuring the Ga 3d-spectrum for the 3d-spectrum predicted for the bond between Ga and nitrogen (the Ga—N bond) and the 3d-spectrum predicted for the bond between Ga and oxygen (Ga—O). In these figures, the solid line corresponds to the Ga—O bond. The broken line corresponds to the Ga—N bond. The dotted line corresponds to the sum of the Ga—O bond and the Ga—N bond.

As shown in FIG. 5A, for the first condition TC1 (without the plasma processing), the peak intensity of the Ga—N bond is higher than the peak intensity of the Ga—O bond.

As shown in FIG. 5B, for the second condition TC2 (with the plasma processing and without the bias power), the peak intensity of the Ga—O bond is higher than the peak intensity of the Ga—N bond.

As shown in FIG. 5C, for the third condition TC3 (with the plasma processing and with a bias power of 200 W), the Ga—N bond is substantially not observed, and a peak of the Ga—O bond is observed.

For example, the characteristics of FIG. 5A correspond to the characteristics of the first partial region 11. In such a case, the characteristics of FIG. 5B or the characteristics of FIG. 5C correspond to the characteristics of the first side surface region sr1. As described above, as illustrated in FIG. 5C, the peak of the Ga—N bond in the first side surface region sr1 may not be observed.

From the results of FIG. 5A to FIG. 5C, by performing the plasma processing as shown in the second condition TC2 and the third condition TC3, the peak intensity of the Ga—O bond becomes higher than the peak intensity of the Ga—N bond. As shown in the third condition TC3, by applying the bias power, the peak intensity of the Ga—O bond becomes even higher. The oxidization of the side surface portions of the semiconductor layers is promoted further by the processing of the third condition TC3; therefore, the alteration of the semiconductor layers is suppressed.

Figure 6A:
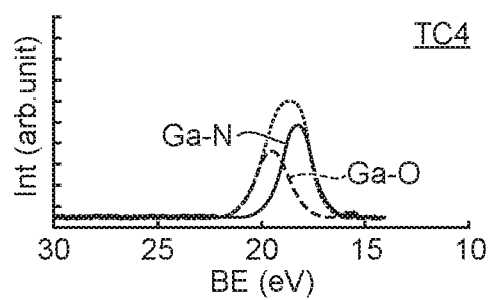
FIG. 6A is a graph illustrating experimental results relating to the light-emitting element.
Figure 6B:
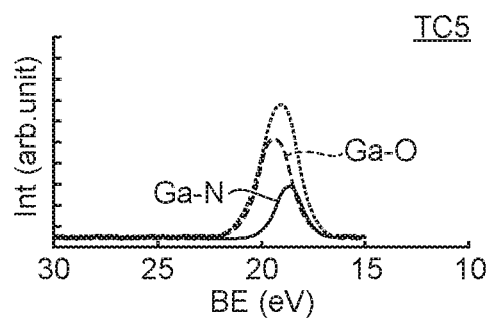
FIG. 6B is a graph illustrating experimental results relating to the light-emitting element.
Figure 6C:
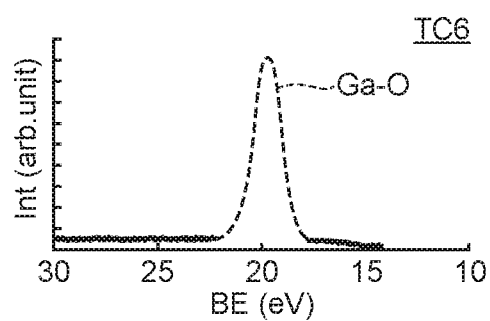
FIG. 6C is a graph illustrating experimental results relating to the light-emitting element.

FIG. 6A to FIG. 6C are graphs illustrating experimental results relating to the light-emitting element.

These figures illustrate XPS analysis results of samples of three types of conditions. Processing of a p-type semiconductor layer (GaN layer) is performed for these samples. FIG. 6A to FIG. 6C correspond respectively to fourth to sixth conditions TC4 to TC6. For the fourth condition TC4, plasma processing is not performed. Plasma processing is performed for the fifth condition TC5 and the sixth condition TC6. For the fifth condition TC5, the bias power is 50 W, the ICP power is 250 W, the flow rate of the oxygen gas is 100 sccm, the partial pressure of the oxygen gas is 8 Pa, and the processing time is 30 seconds. For the sixth condition TC6, the bias power is 200 W, the ICP power is 250 W, the flow rate of the oxygen gas is 100 sccm, the partial pressure of the oxygen gas is 8 Pa, and the processing time is 120 seconds. In these figures, the horizontal axis is the binding energy BE (eV). The vertical axis is the signal intensity Int (arbitrary units). FIG. 6A to FIG. 6C corresponds to the Ga 3d-peak. In these figures, the solid line corresponds to the Ga—O bond. The broken line corresponds to the Ga—N bond. The dotted line corresponds to the sum of the Ga—O bond and the Ga—N bond.

As shown in FIG. 6A, for the fourth condition TC4 (without the plasma processing), the peak intensity of the Ga—N bond is higher than the peak intensity of the Ga—O bond.

As shown in FIG. 6B, for the fifth condition TC5 (with the plasma processing, a bias power of 50 W, and a processing time of 30 seconds), the peak intensity of the Ga—O bond is higher than the peak intensity of the Ga—N bond.

As shown in FIG. 6C, for the sixth condition TC6 (with the plasma processing, a bias power of 200 W, and a processing time of 120 seconds), the Ga—N bond is substantially not observed, and a peak of the Ga—O bond is observed.

For example, the characteristics of FIG. 6A may be considered to correspond to the characteristics of the first partial region 11. The characteristics of FIG. 6B or the characteristics of FIG. 6C correspond to the characteristics of the third side surface region sr3.

From the results of FIG. 6A to FIG. 6C, by performing the plasma processing as shown in the fifth condition TC5 and the sixth condition TC6, the peak intensity of the Ga—O bond becomes higher than the peak intensity of the Ga—N bond. As shown in the sixth condition TC6, by applying a bias power that is higher than that of the fifth condition TC5, the peak intensity of the Ga—O bond becomes even higher. The oxidization of the side surface portions of the semiconductor layers is promoted further by the processing of the sixth condition TC6; therefore, the alteration of the semiconductor layers is suppressed.

Figure 7A:
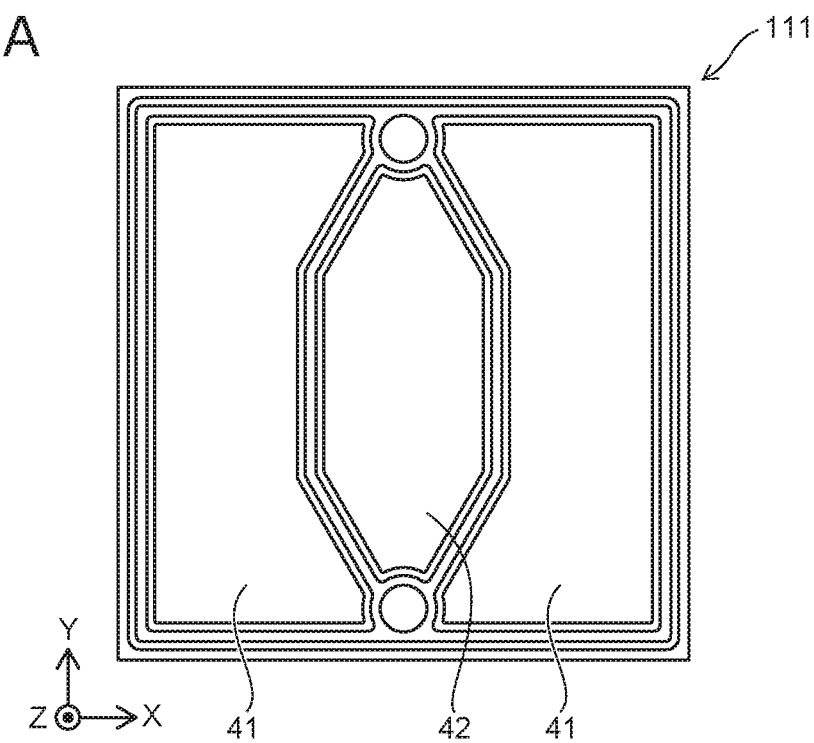
FIG. 7A is a schematic top view of a light-emitting element according to the first embodiment.
Figure 7B:
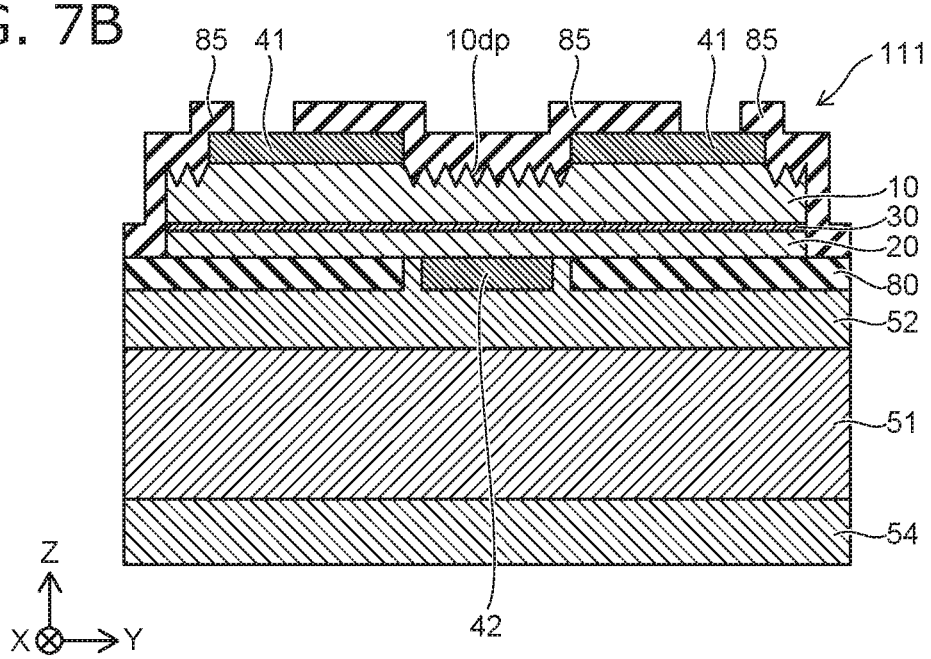
FIG. 7B is a schematic cross-sectional view of the light-emitting element according to the embodiment.

FIG. 7A and FIG. 7B are schematic views illustrating a light-emitting element according to the first embodiment.

FIG. 7A is a schematic top view of the light-emitting element 111. FIG. 7B is a schematic cross-sectional view of the light-emitting element 111. The light-emitting element 111 according to the first embodiment also includes the first semiconductor layer 10, the second semiconductor layer 20, the light-emitting layer 30, the first electrode 41, and the second electrode 42. In the light-emitting element 111, the first semiconductor layer 10 includes the first partial region 11 and the first side surface region sr1.

In the first example, the first partial region 11 includes the bond of gallium and nitrogen, and the first side surface region sr1 does not include the bond of gallium and nitrogen. In the second example, the first partial region 11 does not include the bond of gallium and oxygen, and the first side surface region sr1 includes the bond of gallium and oxygen. In the third example, the second ratio is higher than the first ratio.

The leakage current is suppressed in the light-emitting element 111. For example, the alteration of the semiconductor layers can be suppressed. Therefore, a light-emitting element can be provided in which the electrical characteristics can be stabilized.

Figure 8:
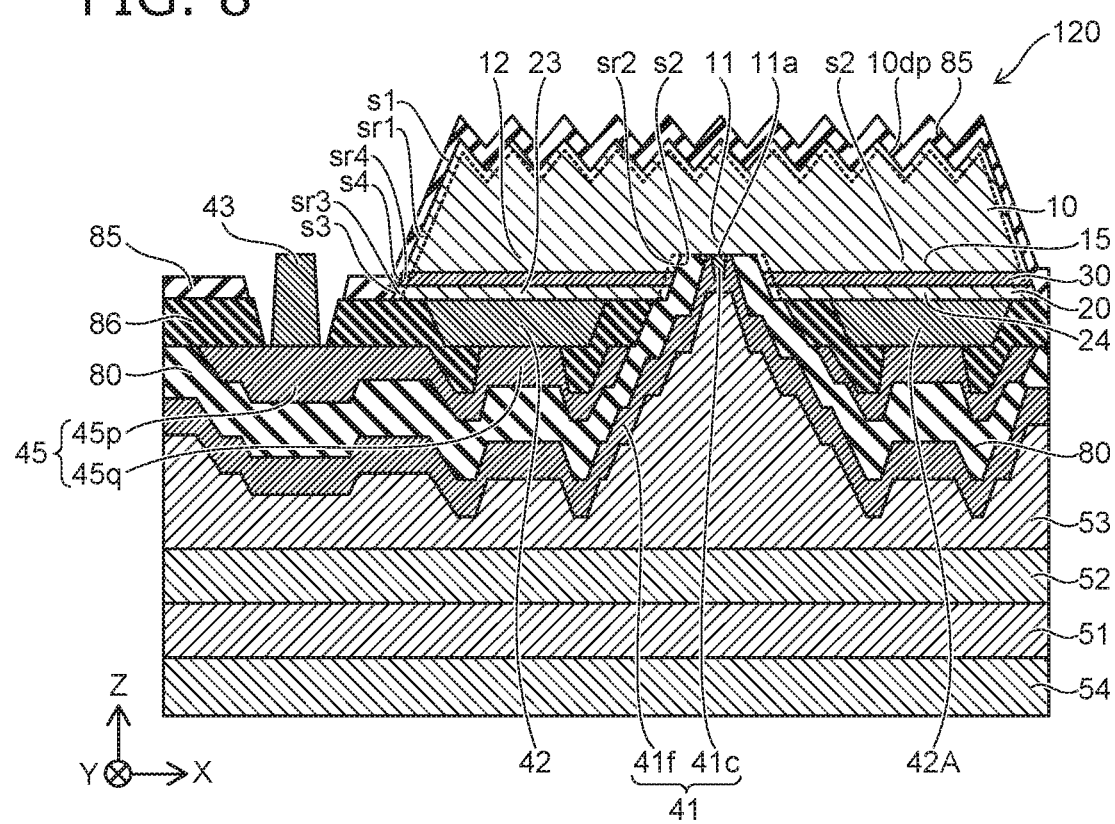
FIG. 8 is a schematic cross-sectional view illustrating a light-emitting element according to the first embodiment.

FIG. 8 is a schematic cross-sectional view illustrating a light-emitting element according to the first embodiment.

As shown in FIG. 8, the light-emitting element 120 according to the first embodiment includes the conductive portion 51, the insulating portion 80, a third electrode 43, and a connection member 45 in addition to the first semiconductor layer 10, the second semiconductor layer 20, the light-emitting layer 30, the first electrode 41, and the second electrode 42. In the light-emitting element 120, the light-emitting layer 30 is provided between the first semiconductor layer 10 and the second semiconductor layer 20. The first electrode 41 is electrically connected to the first semiconductor layer 10. The second electrode 42 (and the electrode 42A) are electrically connected to the second semiconductor layer 20.

In the example, the first electrode 41 is provided at the lower side of the first semiconductor layer 10, while the second electrode 42 and the electrode 42A are provided at the lower side of the second semiconductor layer 20. The conductive portion 51 is electrically connected to the first electrode 41. In the example, the electrode 54 is provided at the lower surface of the conductive portion 51. The third electrode 43 is electrically connected to the second electrode 42 via the connection member 45.

The first semiconductor layer 10 includes the first partial region 11 and the second partial region 12. The direction from the second partial region 12 toward the first partial region 11 crosses the first direction (the Z-axis direction). The first electrode 41 includes a contact portion 41c that contacts the first partial region 11. The contact portion 41c is provided between the conductive portion 51 and the first partial region 11 in the first direction (the Z-axis direction). In the example, the first electrode 41 further includes a first electrode film 41f in addition to the contact portion 41c recited above. The contact portion 41c is provided between the first electrode film 41f and the first partial region 11 (the first surface 11a).

The conductive portion 51 and the first electrode 41 are bonded by the conductive layer 52 and the conductive layer 53. The conductive portion 51 and the first electrode 41 are electrically connected.

The second semiconductor layer 20 includes the third partial region 23. The third partial region 23 is provided between the conductive portion 51 and the second partial region 12 in the first direction (the Z-axis direction). At least a portion of the second electrode 42 is provided between the conductive portion 51 and the third partial region 23 in the first direction (the Z-axis direction).

The insulating portion 80 is provided between the conductive portion 51 and the at least a portion of the second electrode 42 recited above (the portion between the conductive portion 51 and the third partial region 23) in the first direction (the Z-axis direction). The insulating portion 80 electrically insulates between the second electrode 42 and the conductive portion 51.

The connection member 45 (e.g., an interconnect layer) includes a first portion 45p and a second portion 45q. The first portion 45p is provided between the conductive portion 51 and the third electrode 43 in the first direction (the Z-axis direction). The first portion 45p is electrically connected to the third electrode 43.

The second portion 45q of the connection member 45 is provided between the conductive portion 51 and the at least a portion of the second electrode 42 recited above in the first direction (the Z-axis direction). The second portion 45q is electrically connected to the second electrode 42. The third electrode 43 is electrically connected to the second electrode 42 by the connection member 45.

The insulating portion 80 is provided between the connection member 45 and the first electrode 41. The insulating portion 80 electrically insulates between the connection member 45 and the first electrode 41.

The third electrode 43 overlaps at least one of the second electrode 42 or the second semiconductor layer 20 in a direction (in the example of FIG. 8, the X-axis direction) crossing the first direction.

For example, a voltage is applied between the third electrode 43 and the electrode 54. A current is supplied to the light-emitting layer 30 via the first semiconductor layer 10 and the second semiconductor layer 20. Light is emitted from the light-emitting layer 30. The light is emitted from the upper surface of the first semiconductor layer 10. In the example, the unevenness 10dp is provided in the upper surface of the first semiconductor layer 10. The insulating layer 85 is provided at the upper surface and the side surface of the first semiconductor layer 10. The insulating layer 85 is provided also at the side surface of the second semiconductor layer 20 and the side surface of the light-emitting layer 30.

An insulating layer 86 is further provided in the example. The second electrode 42 is provided between the second semiconductor layer 20 and a portion of the insulating layer 86. The insulating layer 86 and the insulating layer 85 contact each other at the outer edge portion of the light-emitting element 120. The insulating layer 86 and the insulating layer 85 contact each other also at the portion between the third electrode 43 and the second electrode 42 (the separated-element end). The semiconductor layers are protected thereby.

In the light-emitting element 120, the first semiconductor layer 10 includes the first side surface region sr1. The first side surface region sr1 includes the first side surface s1 crossing the plane (the X-Y plane) perpendicular to the first direction (the Z-axis direction). On the other hand, as described above, the first semiconductor layer 10 includes the first partial region 11. The first partial region 11 includes the first surface 11a contacting the first electrode 41 (the contact portion 41c). For example, the first partial region 11 does not include the first side surface s1. For example, the first side surface region sr1 does not include the first surface 11a.

In the light-emitting element 120, the first partial region 11 includes the bond of gallium and nitrogen, and the first side surface region sr1 does not include the bond of gallium and nitrogen (the first condition). Or, the first partial region 11 does not include the bond of gallium and oxygen, and the first side surface region sr1 includes the bond of gallium and oxygen (the second condition). Or, the second ratio is higher than the first ratio (the third condition).

As described above, the first ratio is the ratio of the first peak intensity p1 corresponding to the bond of gallium and oxygen in the first partial region 11 in the X-ray photoelectron spectroscopy to the second peak intensity p2 corresponding to the bond of gallium and nitrogen in the first partial region 11 in the X-ray photoelectron spectroscopy. The second ratio is the ratio of the third peak intensity p3 corresponding to the bond of gallium and oxygen in the first side surface region sr1 in the X-ray photoelectron spectroscopy to the fourth peak intensity p4 corresponding to the bond of gallium and nitrogen in the first side surface region sr1 in the X-ray photoelectron spectroscopy.

The leakage current is suppressed in the light-emitting element 120. For example, the alteration of the semiconductor layers can be suppressed. A light-emitting element can be provided in which the electrical characteristics can be stabilized.

As shown in FIG. 8, the first semiconductor layer 10 may further include a second side surface region sr2. The second side surface region sr2 includes a second side surface s2 crossing the X-Y plane. For example, the first partial region 11 does not include the second side surface s2. For example, the second side surface region sr2 does not include the first surface 11a. The second side surface s2 is between the first side surface s1 and the first surface 11a in the direction from the first side surface s1 toward the first surface 11a.

The second side surface region sr2 may have characteristics substantially similar to the characteristics of the first side surface region sr1 (the characteristics illustrated in FIG. 2B).

Figure 9:
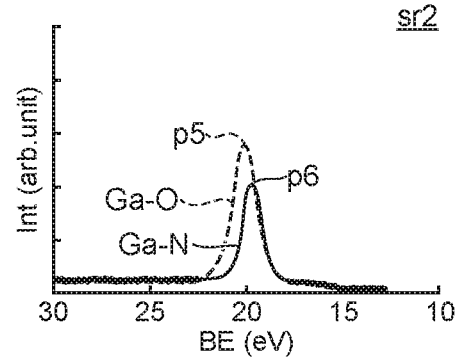
FIG. 9 is a graph illustrating the light-emitting element according to the first embodiment.

FIG. 9 is a graph illustrating the light-emitting element according to the first embodiment.

FIG. 9 illustrates signals obtained in X-ray photoelectron spectroscopy. FIG. 9 corresponds to the second side surface region sr2. The horizontal axis is the binding energy BE (eV). The vertical axis is the signal intensity Int (arbitrary units). FIG. 9 illustrates the results of peak fitting by X-ray photoelectron spectroscopy of the spectra obtained by measuring the Ga 3d-spectrum for the 3d-spectrum predicted for the bond between Ga and nitrogen (the Ga—N bond) and the 3d-spectrum predicted for the bond between Ga and oxygen (Ga—O). In FIG. 9, the solid line corresponds to the bond between Ga and nitrogen (the Ga—N bond). The broken line corresponds to the bond between Ga and oxygen (the Ga—O bond).

As shown in FIG. 9, the peak intensity that corresponds to the bond of gallium and oxygen in the second side surface region sr2 in the X-ray photoelectron spectroscopy is taken as a fifth peak intensity p5. The peak intensity that corresponds to the bond of gallium and nitrogen in the second side surface region sr2 in the X-ray photoelectron spectroscopy is taken as a sixth peak intensity p6. The ratio of the fifth peak intensity p5 to the sixth peak intensity p6 is taken as a third ratio. The third ratio is higher than the first ratio (referring to FIG. 2A). The third ratio is, for example, 1 or more. The third ratio may exceed 1.

The leakage current is suppressed in the second side surface region sr2. For example, the alteration of the semiconductor layers can be suppressed. A light-emitting element can be provided in which the electrical characteristics can be stabilized further.

In the light-emitting element 120, the second semiconductor layer 20 may include the third side surface region sr3 including the third side surface s3. As described above, the fourth ratio may be higher than the first ratio. The light-emitting layer 30 may include the fourth side surface region sr4 including the fourth side surface s4. As described above, the fifth ratio may be higher than the first ratio.

As shown in FIG. 8, the second semiconductor layer 20 may further include the fourth partial region 24, and the first semiconductor layer 10 may further include a fifth partial region 15. The position of the first partial region 11 in a second direction (e.g., the X-axis direction) orthogonal to the first direction (the Z-axis direction) is between the position of the second partial region 12 in the second direction and the position of the fifth partial region 15 in the second direction. The fourth partial region 24 is provided between the conductive portion 51 and the fifth partial region 15 in the first direction (the Z-axis direction). An other portion of the second electrode 42 (the electrode 42A) is provided between the conductive portion 51 and the fourth partial region 24 in the first direction (the Z-axis direction).

In the light-emitting element 120, the contact portion 41c is provided between two partial regions of the semiconductor layers.

An example of a method for manufacturing the light-emitting element 120 will now be described.

FIG. 10A, FIG. 10B, FIG. 11A, and FIG. 11B are schematic cross-sectional views illustrating the method for manufacturing the light-emitting element according to the first embodiment.

Figure 10A:
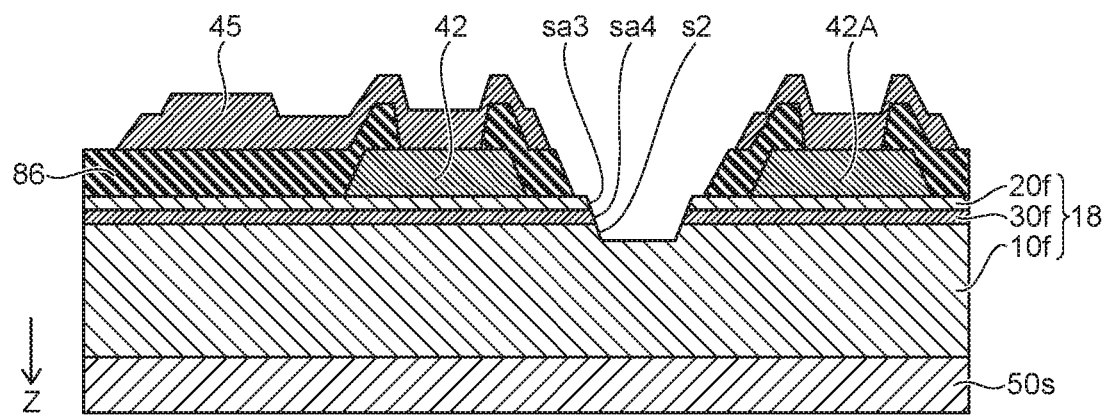
FIG. 10A is a schematic cross-sectional view illustrating a method for manufacturing the light-emitting element according to the first embodiment.

The semiconductor stacked body 18 is prepared as shown in FIG. 10A. The semiconductor stacked body 18 includes the n-type first semiconductor film 10f, the p-type second semiconductor film 20f, and the light-emitting film 30f. For example, the semiconductor stacked body 18 is epitaxially grown on the growth substrate 50s (e.g., a sapphire substrate). The first semiconductor film 10f is used to form the first semiconductor layer 10. The second semiconductor film 20f is used to form the second semiconductor layer 20. The light-emitting film 30f is used to form the light-emitting layer 30. The second electrode 42 (and the electrode 42A) is formed on the second semiconductor film 20f. The insulating layer 86 that covers the upper surface of the second semiconductor film 20f and a portion of the second electrode 42 (and the electrode 42A) is formed. The connection member 45 that covers the insulating layer 86 from above and is electrically connected to the second electrode 42 (and the electrode 42A) is formed.

A portion of the semiconductor stacked body 18 (the first semiconductor film 10f, the second semiconductor film 20f, and the light-emitting film 30f) is removed (a second removal process). For example, the removal of the semiconductor stacked body 18 is performed by RIE. At least the side surface (the second side surface s2) of the first semiconductor layer 10 is exposed. For example, the side surface (a side surface sa4) of the light-emitting layer 30 and the side surface (a side surface sa3) of the second semiconductor layer 20 are exposed.

The semiconductor stacked body 18 after the second removal process is processed in an atmosphere including oxygen. Thereby, oxygen is introduced to the portion including the side surface (the second side surface s2) of the first semiconductor layer 10 (a second processing process). In the second processing process, oxygen may be introduced to the portion including the side surface (the side surface sa3) of the second semiconductor layer 20 and the portion including the side surface (the side surface sa4) of the light-emitting layer 30.

Figure 10B:
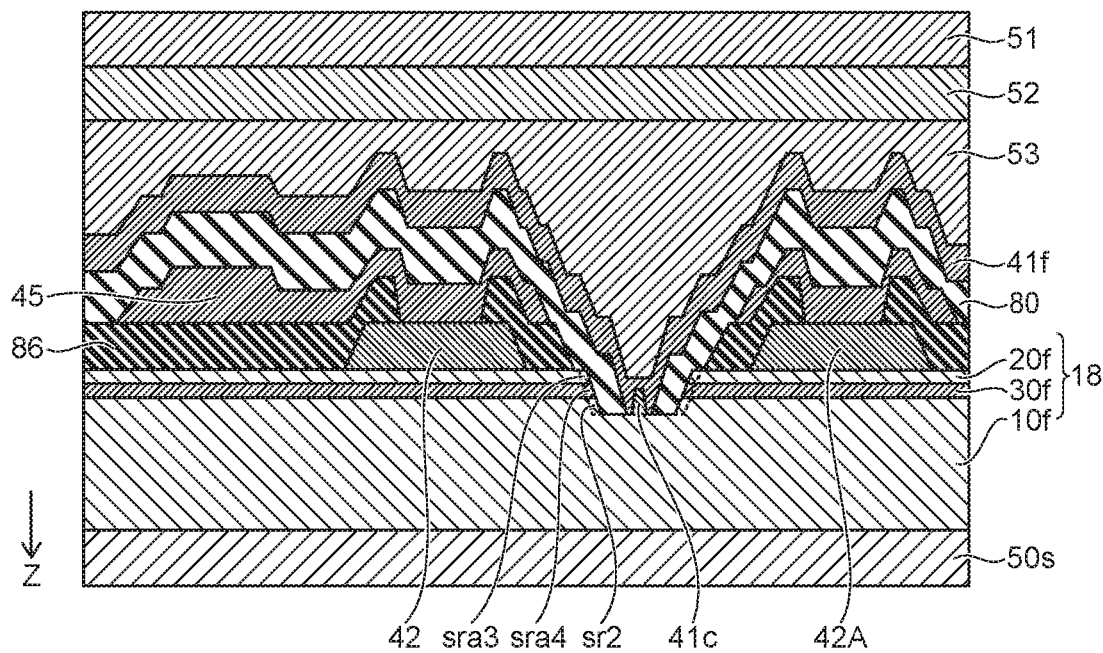
FIG. 10B is a schematic cross-sectional view illustrating the method for manufacturing the light-emitting element according to the first embodiment.

Thereby, as shown in FIG. 10B, the bond of gallium and oxygen is formed in the portion (the second side surface region sr2) including the side surface (the second side surface s2) of the first semiconductor layer 10. The bond of gallium and oxygen may be formed in the portion (a side surface region sra3) including the side surface (the side surface sa3) of the second semiconductor layer 20. The bond of gallium and oxygen may be formed in the portion (a side surface region sra4) including the side surface (the side surface sa4) of the light-emitting layer 30.

As shown in FIG. 10B, the insulating portion 80 that covers the semiconductor stacked body 18, the insulating layer 86, and the connection member 45 is formed. The first electrode film 41f that covers the insulating portion 80 and is connected to the first semiconductor film 10f and the contact portion 41c is formed. The conductive layer 53 is formed on the first electrode film 41f. The conductive portion 51 on which the conductive layer 52 (e.g., a bonding layer) is provided is prepared. The conductive layer 52 and the conductive layer 53 are bonded.

Figure 11A:
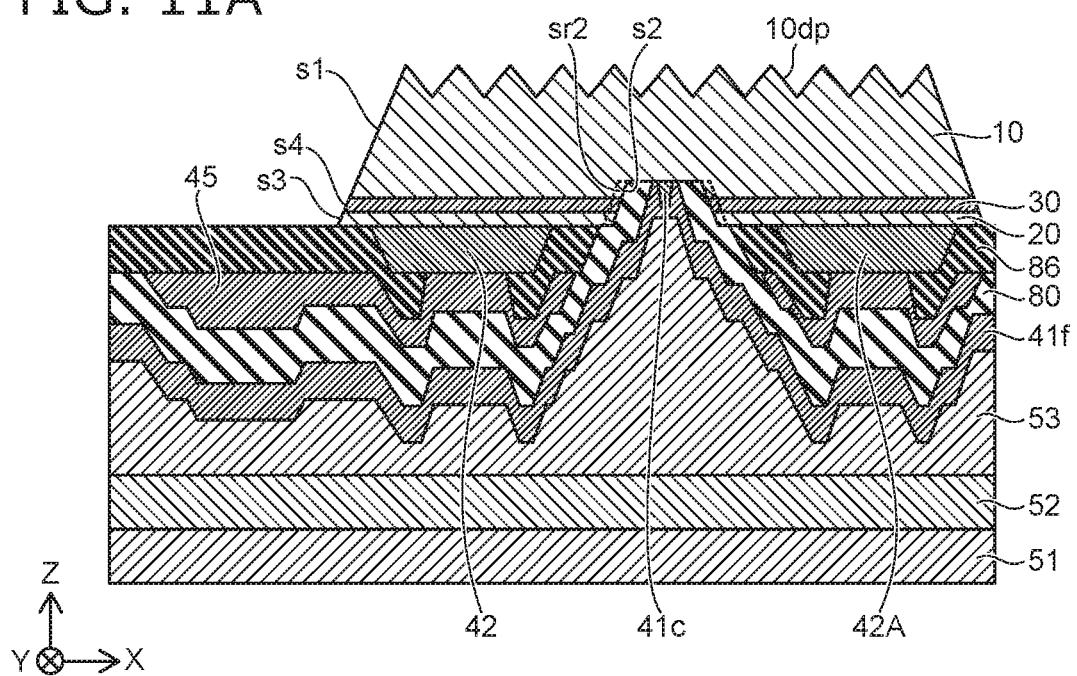
FIG. 11A is a schematic cross-sectional view illustrating the method for manufacturing the light-emitting element according to the first embodiment.

The growth substrate 50s is removed as shown in FIG. 11A. For example, the surface of the first semiconductor film 10f is exposed. For example, the removal of the substrate 50s is performed by at least one of ultraviolet irradiation, etching, or polishing.

As shown in FIG. 11A, a portion of the semiconductor stacked body 18 (the first semiconductor film 10f, the second semiconductor film 20f, and the light-emitting film 30f) is removed (the first removal process). For example, element separation is performed by a portion of the surface of the insulating layer 86 under the semiconductor stacked body 18 being exposed. By the first removal process, the first semiconductor layer 10 is obtained from the first semiconductor film 10f, the second semiconductor layer 20 is obtained from the second semiconductor film 20f, and the light-emitting layer 30 is obtained from the light-emitting film 30f. At least the side surface (the first side surface s1) of the first semiconductor layer 10 is exposed. For example, the side surface (the fourth side surface s4) of the light-emitting layer 30 and the side surface (the third side surface s3) of the second semiconductor layer 20 are exposed. The unevenness 10dp is formed in the surface of the first semiconductor layer 10 by performing wet etching and/or dry etching. To increase the light extraction efficiency of the light-emitting element, the height difference of the unevenness 10dp may be set to, for example, 0.2 μm to 3.0 μm.

Figure 11B:
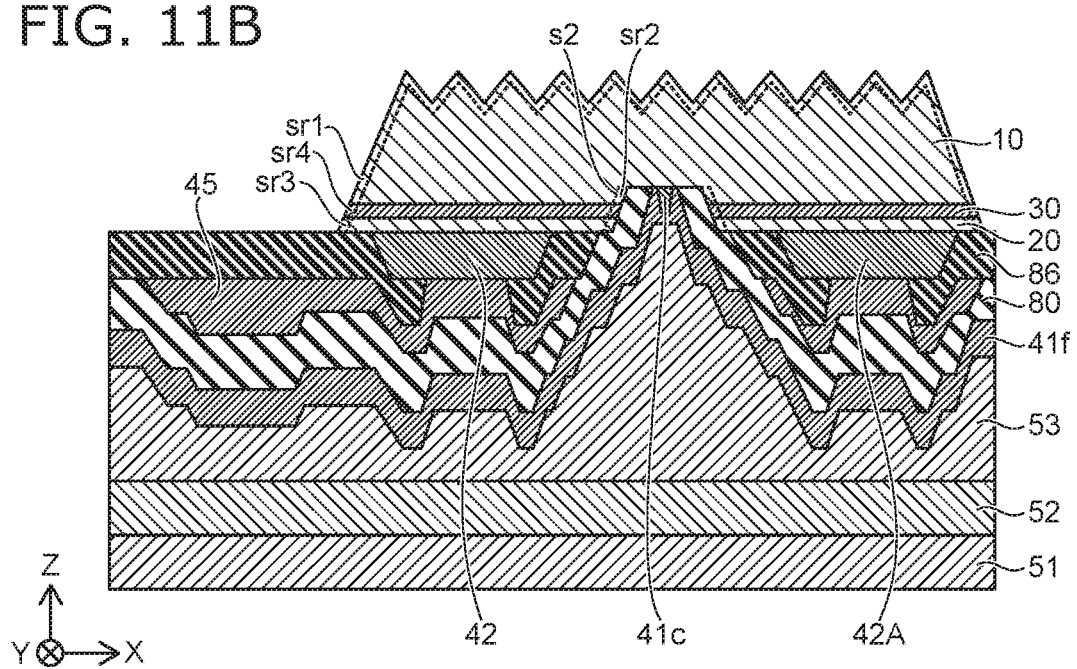
FIG. 11B is a schematic cross-sectional view illustrating the method for manufacturing the light-emitting element according to the first embodiment.

As shown in FIG. 11B, the semiconductor stacked body 18 after the first removal process is processed in an atmosphere including oxygen (the first processing process). For example, plasma processing in the atmosphere including oxygen is performed. For example, the plasma processing is performed while applying a bias power. For example, the first side surface region sr1 that includes the bond of gallium and oxygen is formed by the first processing process. For example, the third side surface region sr3 that includes the bond of gallium and oxygen may be formed. For example, the fourth side surface region sr4 that includes the bond of gallium and oxygen may be formed.

Subsequently, the insulating layer 85 is formed as necessary. The electrode 54 is formed at the lower surface of the conductive portion 51. The light-emitting element 120 is obtained thereby.

In the first embodiment, various modifications of the arrangements of the semiconductor layers and the electrodes are possible.

Figure 12:
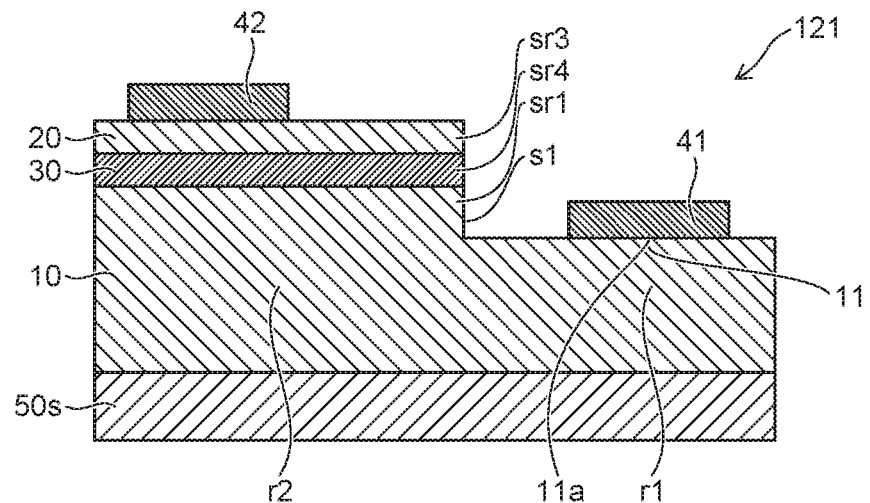
FIG. 12 is a schematic cross-sectional view illustrating a light-emitting element according to the first embodiment.

FIG. 12 is a schematic cross-sectional view illustrating a light-emitting element according to the first embodiment.

As shown in FIG. 12, the light-emitting element 121 according to the first embodiment also includes the first semiconductor layer 10, the second semiconductor layer 20, the light-emitting layer 30, the first electrode 41, and the second electrode 42. The substrate 50s (the growth substrate) is provided. The first semiconductor layer 10 is provided on the substrate 50s. The first electrode 41 is provided at a first region r1 of the first semiconductor layer 10. The light-emitting layer 30 is on a second region r2 of the first semiconductor layer 10. The second semiconductor layer 20 is on the light-emitting layer 30. The second electrode 42 is provided on the second semiconductor layer 20.

The first side surface region sr1 and the first partial region 11 are provided in the light-emitting element 121. For example, the first partial region 11 includes the bond of gallium and nitrogen, and the first side surface region sr1 does not include the bond of gallium and nitrogen (the first condition). Or, the first partial region 11 does not include the bond of gallium and oxygen, and the first side surface region sr1 includes the bond of gallium and oxygen (the second condition). Or, the second ratio is higher than the first ratio (the third condition). The leakage current is suppressed. For example, the alteration of the semiconductor layers can be suppressed. A light-emitting element can be provided in which the electrical characteristics can be stabilized further.

The third side surface region sr3 and the fourth side surface region sr4 may be provided in the light-emitting element 121. For example, the fourth ratio may be higher than the first ratio. For example, the fifth ratio may be higher than the first ratio.

For example, conditions described in reference to the experiment of FIG. 5A to FIG. 5C can be modified as appropriate and applied to the X-ray photoelectron spectroscopy relating to the first partial region 11, the first side surface region sr1, the second partial region 12, the second side surface region sr2, the third side surface region sr3, the fourth side surface region sr4, etc.

Second Embodiment

The second embodiment relates to a method for manufacturing a light-emitting element.

Figure 13:
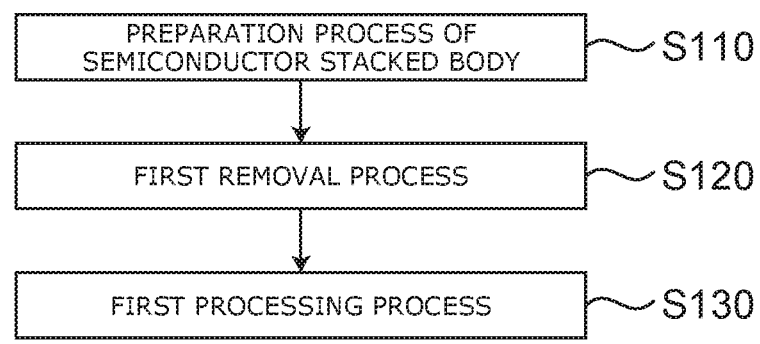
FIG. 13 is a flowchart illustrating a method for manufacturing a light-emitting element according to a second embodiment.

FIG. 13 is a flowchart illustrating the method for manufacturing the light-emitting element according to the second embodiment.

As shown in FIG. 13, the manufacturing method according to the second embodiment includes a preparation process of preparing the semiconductor stacked body 18 (referring to FIG. 3A) (step S110). The semiconductor stacked body 18 includes the n-type first semiconductor layer 10 (the first semiconductor film 10f) including gallium and nitrogen, the p-type second semiconductor layer 20 (the second semiconductor film 20f) including gallium and nitrogen, and the light-emitting layer 30 (the light-emitting film 30f). The light-emitting layer 30 (the light-emitting film 30f) is provided between the first semiconductor layer 10 (the first semiconductor film 10f) and the second semiconductor layer 20 (the second semiconductor film 20f).

The manufacturing method includes a first removal process (step S120). In the first removal process, at least the side surface (the first side surface s1) of the first semiconductor layer 10 is exposed by removing a portion of the first semiconductor layer 10 (the first semiconductor film 10f), a portion of the second semiconductor layer 20 (the second semiconductor film 20f), and a portion of the light-emitting layer 30 (the light-emitting film 30f). For example, the processing described in reference to FIG. 4A or the processing described in reference to FIG. 11A is performed.

The manufacturing method includes a first processing process (step S130). In the first processing process, oxygen is introduced to the portion including the side surface recited above by processing the semiconductor stacked body 18 after the first removal process (step S120) in an atmosphere including oxygen. For example, the processing described in reference to FIG. 4D or the processing described in reference to FIG. 11B is performed.

For example, the leakage current is suppressed. For example, the alteration of the semiconductor layers can be suppressed. A method for manufacturing a light-emitting element can be provided in which the electrical characteristics can be stabilized further.

Figure 14:
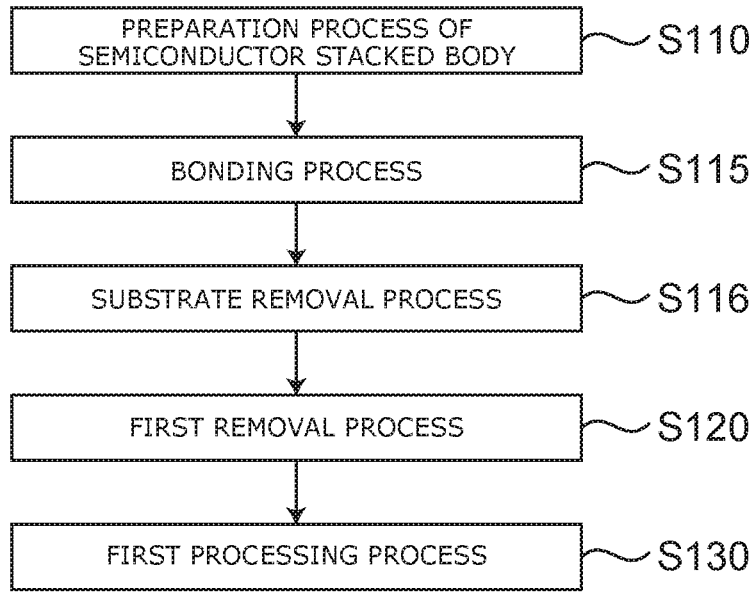
FIG. 14 is a flowchart illustrating the method for manufacturing the light-emitting element according to the second embodiment.

FIG. 14 is a flowchart illustrating a method for manufacturing the light-emitting element according to the second embodiment.

As shown in FIG. 14, the manufacturing method according to the second embodiment may further include a bonding process (step S115) and a substrate removal process (step S116). A support body (the conductive portion 51) and the semiconductor stacked body 18 are bonded in the bonding process. For example, the processing described in reference to FIG. 3D is performed. The substrate 50s is removed in the substrate removal process. For example, the processing described in reference to FIG. 3E is performed.

In the preparation process recited above (step S110), the semiconductor stacked body 18 is formed on the substrate 50s. The substrate removal process is performed after the bonding process. The first removal process and the first processing process are performed after the substrate removal process.

Figure 15:
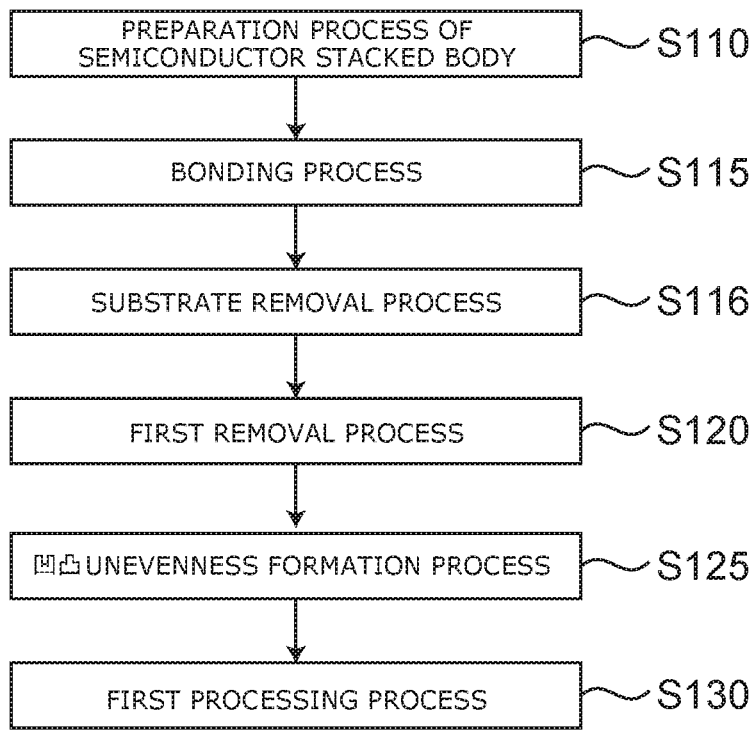
FIG. 15 is a flowchart illustrating the method for manufacturing the light-emitting element according to the second embodiment.

FIG. 15 is a flowchart illustrating a method for manufacturing the light-emitting element according to the second embodiment.

As shown in FIG. 15, the manufacturing method may further include an unevenness formation process (step S125). In the unevenness formation process, the unevenness 10dp is formed in the surface of the first semiconductor layer 10. For example, the processing described in reference to FIG. 4C is performed. In the example, the first processing process (step S130) is performed after the unevenness formation process (step S125). For example, the unevenness formation process (step S125) is performed between the first removal process (step S120) and the first processing process (step S130).

Figure 16:
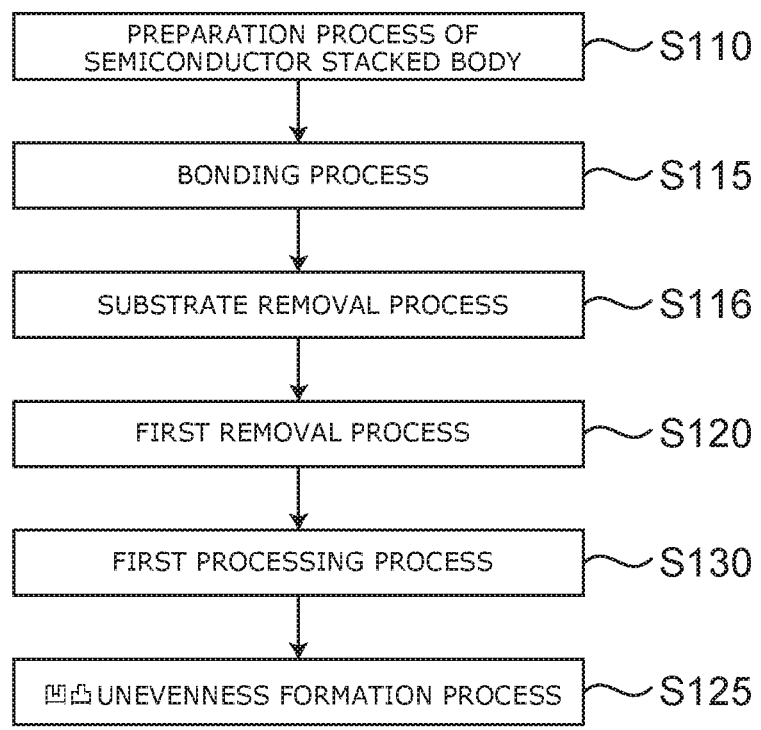
FIG. 16 is a flowchart illustrating the method for manufacturing the light-emitting element according to the second embodiment.

FIG. 16 is a flowchart illustrating a method for manufacturing the light-emitting element according to the second embodiment.

As shown in FIG. 16, in the example, the manufacturing method includes the unevenness formation process (step S125). In the example, the first processing process (step S130) is performed between the first removal process (step S120) and the unevenness formation process (step S125).

Thus, the first processing process (step S130) may be performed between the first removal process (step S120) and the unevenness formation process (step S125) or after the unevenness formation process (step S125). In both cases, for example, oxygen can be introduced to the first side surface region sr1 including the first side surface s1 of the first semiconductor layer 10.

Figure 17:
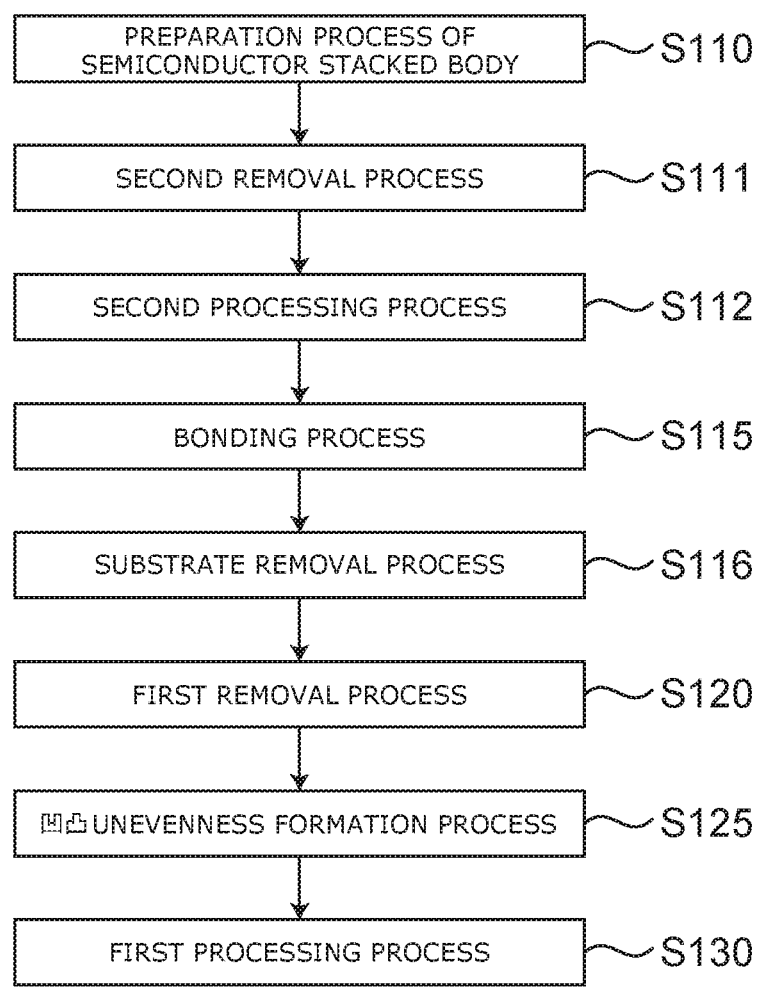
FIG. 17 is a flowchart illustrating the method for manufacturing the light-emitting element according to the second embodiment.

FIG. 17 is a flowchart illustrating a method for manufacturing the light-emitting element according to the second embodiment.

As shown in FIG. 17, the manufacturing method may further include a second removal process (step S111) and a second processing process (step S112).

In the second removal process, an other side surface (the second side surface s2) of the first semiconductor layer 10 is exposed by removing an other portion of the first semiconductor layer 10, an other portion of the second semiconductor layer 20, and an other portion of the light-emitting layer 30. For example, the processing described in reference to FIG. 10A is performed.

In the second processing process, oxygen is introduced to the portion including the other side surface (the second side surface s2) recited above by processing the semiconductor stacked body 18 after the second removal process in an atmosphere including oxygen. For example, the processing described in reference to FIG. 10B is performed. The second side surface region sr2 that includes the bond of gallium and oxygen is formed thereby.

For example, the second removal process (step S111) is performed between the preparation process (step S110) and the bonding process (step S115). The second processing process (step S112) is performed between the second removal process (step S111) and the bonding process (step S115).

For example, the second removal process (step S111) and the second processing process (step S112) are performed in the example of the method for manufacturing the light-emitting element 120.

According to the embodiments, a light-emitting element and a method for manufacturing the light-emitting element can be provided in which the electrical characteristics can be stabilized.

In the specification of the application, "perpendicular" and "parallel" refer to not only strictly perpendicular and strictly parallel but also include, for example, fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in light-emitting elements such as semiconductor layers, electrodes, connection members, conductive portions, insulating portions, insulating layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all light-emitting elements, and methods for manufacturing the same practicable by an appropriate design modification by one skilled in the art based on the light-emitting elements, and the methods for manufacturing the same described above as embodiments of the invention also are within the scope of the invention to the extent that the purpose of the invention is included.

Various other variations and modifications can be conceived by those skilled in the art within the spirit of the invention, and it is understood that such variations and modifications are also encompassed within the scope of the invention.

What is claimed is:

1. A light-emitting element comprising:
   a first semiconductor layer of an n-type, the first semiconductor layer comprising gallium and nitrogen;
   a second semiconductor layer of a p-type, the second semiconductor layer comprising gallium and nitrogen;
   a light-emitting layer provided between the first semiconductor layer and the second semiconductor layer;

a first electrode electrically connected to the first semiconductor layer;
a second electrode electrically connected to the second semiconductor layer;
a conductive portion electrically connected to the second electrode; and
an insulating portion; wherein:
the first semiconductor layer comprises a first partial region and a first side surface region;
the first partial region includes a first surface contacting the first electrode;
the first side surface region comprises a first side surface crossing a plane perpendicular to a first direction, the first direction being from the second semiconductor layer toward the first semiconductor layer;
(i) the first partial region includes a bond of gallium and nitrogen, and the first side surface region does not including the bond of gallium and nitrogen, or (ii) the first partial region does not include a bond of gallium and oxygen, and the first side surface region includes the bond of gallium and oxygen, or (iii) where a first ratio is a ratio of a first peak intensity to a second peak intensity, the first peak intensity corresponding to the bond of gallium and oxygen in the first partial region in X-ray photoelectron spectroscopy, the second peak intensity corresponding to the bond of gallium and nitrogen in the first partial region in the X-ray photoelectron spectroscopy, and a second ratio is a ratio of a third peak intensity to a fourth peak intensity, the third peak intensity corresponding to the bond of gallium and oxygen in the first side surface region in the X-ray photoelectron spectroscopy, the fourth peak intensity corresponding to the bond of gallium and nitrogen in the first side surface region in the X-ray photoelectron spectroscopy, the second ratio is higher than the first ratio;
the first semiconductor layer further comprises a second partial region;
a direction from the second partial region toward the first partial region crosses the first direction;
the second semiconductor layer comprises a third partial region and a fourth partial region;
the first partial region is provided between the third partial region and the first electrode in the first direction;
the fourth partial region is provided between the second electrode and the second partial region in the first direction;
the first partial region is provided between the conductive portion and the first electrode in the first direction;
the third partial region is provided between the conductive portion and the first partial region in the first direction;
the insulating portion is provided between the conductive portion and the third partial region in the first direction;
the fourth partial region is provided between the conductive portion and the second partial region in the first direction; and
the second electrode is provided between the conductive portion and the fourth partial region in the first direction.

2. The element according to claim 1, wherein a portion of the first semiconductor layer, a portion of the light-emitting layer, and a portion of the second semiconductor layer are provided between the first electrode and the second electrode.

3. A light-emitting element comprising:
a first semiconductor layer of an n-type, the first semiconductor layer comprising gallium and nitrogen;
a second semiconductor layer of a p-type, the second semiconductor layer comprising gallium and nitrogen;
a light-emitting layer provided between the first semiconductor layer and the second semiconductor layer;
a first electrode electrically connected to the first semiconductor layer;
a second electrode electrically connected to the second semiconductor layer;
a conductive portion electrically connected to the first electrode; and
an insulating portion; wherein:
the first semiconductor layer comprises a first partial region and a first side surface region;
the first partial region includes a first surface contacting the first electrode;
the first side surface region comprises a first side surface crossing a plane perpendicular to a first direction, the first direction being from the second semiconductor layer toward the first semiconductor layer; and
(i) the first partial region includes a bond of gallium and nitrogen, and the first side surface region does not including the bond of gallium and nitrogen, or (ii) the first partial region does not include a bond of gallium and oxygen, and the first side surface region includes the bond of gallium and oxygen, or (iii) where a first ratio is a ratio of a first peak intensity to a second peak intensity, the first peak intensity corresponding to the bond of gallium and oxygen in the first partial region in X-ray photoelectron spectroscopy, the second peak intensity corresponding to the bond of gallium and nitrogen in the first partial region in the X-ray photoelectron spectroscopy, and a second ratio is a ratio of a third peak intensity to a fourth peak intensity, the third peak intensity corresponding to the bond of gallium and oxygen in the first side surface region in the X-ray photoelectron spectroscopy, the fourth peak intensity corresponding to the bond of gallium and nitrogen in the first side surface region in the X-ray photoelectron spectroscopy, the second ratio is higher than the first ratio
the first electrode comprises a contact portion contacting the first partial region;
the first semiconductor layer further includes a second partial region;
a direction from the second partial region toward the first partial region crosses the first direction;
the contact portion is provided between the conductive portion and the first partial region in the first direction;
the second semiconductor layer comprises a third partial region;
the third partial region is provided between the conductive portion and the second partial region in the first direction;
at least a portion of the second electrode is provided between the conductive portion and the third partial region in the first direction; and
the insulating portion is provided between the conductive portion and the at least a portion of the second electrode in the first direction.

4. The element according to claim 3, further comprising:
a third electrode; and
a connection member;
wherein a first portion of the connection member is electrically connected to the third electrode and provided between the conductive portion and the third electrode in the first direction, wherein second portion of the connection member is electrically connected to the second electrode and provided between the conductive portion and the at least a portion of the second electrode in the first direction.

5. The element according to claim 4, wherein the insulating portion is provided between the connection member and the first electrode.

6. The element according to claim 4, wherein the third electrode overlaps at least one of the second electrode or the second semiconductor layer in a direction crossing the first direction.

7. The element according to claim 3, wherein:
the first semiconductor layer further comprises a second side surface region;
the second side surface region includes a second side surface crossing the plane;
the first partial region does not include the second side surface;
the second side surface region does not include the first surface;
the second side surface is between the first side surface and the first surface in a direction from the first side surface toward the first surface; and
where a third ratio is a ratio of a fifth peak intensity to a sixth peak intensity, the fifth peak intensity corresponding to the bond of gallium and oxygen in the second side surface region in the X-ray photoelectron spectroscopy, the sixth peak intensity corresponding to the bond of gallium and nitrogen in the second side surface region in the X-ray photoelectron spectroscopy, the third ratio is higher than the first ratio.

8. The element according to claim 3, wherein:
the second semiconductor layer further comprises a fourth partial region;
the first semiconductor layer further comprises a fifth partial region;
a position of the first partial region in a second direction orthogonal to the first direction is between a position of the second partial region in the second direction and a position of the fifth partial region in the second direction;
the fourth partial region is provided between the conductive portion and the fifth partial region in the first direction; and
an other portion of the second electrode is provided between the conductive portion and the fourth partial region in the first direction.

9. The element according to claim 1, wherein:
the second semiconductor layer comprises a third side surface region;
the third side surface region comprises a third side surface crossing the plane;
where the fourth ratio is a ratio of a seventh peak intensity to an eighth peak intensity, the seventh peak intensity corresponding to the bond of gallium and oxygen in the third side surface region in the X-ray photoelectron spectroscopy, the eighth peak intensity corresponding to the bond of gallium and nitrogen in the third side surface region in the X-ray photoelectron spectroscopy, the fourth ratio is higher than the first ratio.

10. The element according to claim 1, wherein:
the light-emitting layer comprises a fourth side surface region;
the fourth side surface region comprises a fourth side surface crossing the plane; and
where a fifth ratio is a ratio of a ninth peak intensity to a tenth peak intensity, the ninth peak intensity corresponding to the bond of gallium and oxygen in the fourth side surface region in the X-ray photoelectron spectroscopy, the tenth peak intensity corresponding to the bond of gallium and nitrogen in the fourth side surface region in the X-ray photoelectron spectroscopy, the fifth ratio is higher than the first ratio.

11. A method for manufacturing a light-emitting element, the method comprising:
a preparing step comprising preparing a semiconductor stacked body, the semiconductor stacked body comprising a first semiconductor layer, a second semiconductor layer, and a light-emitting layer located between the first semiconductor layer and the second semiconductor layer, the first semiconductor layer comprising gallium and nitrogen and being of an n-type, the second semiconductor layer comprising gallium and nitrogen and being of a p-type;
a first exposing step comprising exposing at least a side surface of the first semiconductor layer by removing a portion of the first semiconductor layer, a portion of the second semiconductor layer, and a portion of the light-emitting layer; and
a first introducing step comprising introducing oxygen to a portion of the semiconductor stacked body including the side surface by processing, in an atmosphere including oxygen, the semiconductor stacked body after the first exposing,
a bonding step comprising bonding a support body and the semiconductor stacked body;
a removing step comprising removing a substrate;
a second exposing step; and
a second introducing step; wherein:
the semiconductor stacked body is formed on the substrate in the preparing step;
the removing step is performed after the bonding step; and
the first exposing step and the first introducing step are performed after the removing step,
the second exposing step comprises exposing an other side surface of the first semiconductor layer by removing an other portion of the first semiconductor layer, an other portion of the second semiconductor layer, and an other portion of the light-emitting layer;
the second introducing step comprises, after the second exposing step, introducing oxygen to a portion of the semiconductor stacked body including the other side surface by processing, in an atmosphere including oxygen, the semiconductor stacked body;
the second exposing step is performed between the preparing step and the bonding step; and
the second introducing step is performed between the second exposing step and the bonding step.

12. The method according to claim 11, further comprising:
a forming step comprising forming an unevenness in a surface of the first semiconductor layer;
wherein the first introducing step is performed between the first exposing step and the forming step, or is performed after the forming step.

13. A light-emitting element comprising:
a first semiconductor layer of an n-type, the first semiconductor layer comprising gallium and nitrogen;
a second semiconductor layer of a p-type, the second semiconductor layer comprising gallium and nitrogen;
a light-emitting layer provided between the first semiconductor layer and the second semiconductor layer;
a first electrode electrically connected to the first semiconductor layer; and a second electrode electrically connected to the second semiconductor layer; wherein:

the first semiconductor layer comprises a first partial region and a first side surface region;

the first partial region includes a first surface contacting the first electrode;

the first side surface region comprises a first side surface crossing a plane perpendicular to a first direction, the first direction being from the second semiconductor layer toward the first semiconductor layer;

(i) the first partial region includes a bond of gallium and nitrogen, and the first side surface region does not including the bond of gallium and nitrogen, or (ii) the first partial region does not include a bond of gallium and oxygen, and the first side surface region includes the bond of gallium and oxygen, or (iii) where a first ratio is a ratio of a first peak intensity to a second peak intensity, the first peak intensity corresponding to the bond of gallium and oxygen in the first partial region in X-ray photoelectron spectroscopy, the second peak intensity corresponding to the bond of gallium and nitrogen in the first partial region in the X-ray photoelectron spectroscopy, and a second ratio is a ratio of a third peak intensity to a fourth peak intensity, the third peak intensity corresponding to the bond of gallium and oxygen in the first side surface region in the X-ray photoelectron spectroscopy, the fourth peak intensity corresponding to the bond of gallium and nitrogen in the first side surface region in the X-ray photoelectron spectroscopy, the second ratio is higher than the first ratio; and the first electrode is provided only on the first partial region.

14. The element according to claim 13, wherein a portion of the first semiconductor layer, a portion of the light-emitting layer, and a portion of the second semiconductor layer are provided between the first electrode and the second electrode.

15. The element according to claim 13, wherein:
the first semiconductor layer further comprises a second partial region;
a direction from the second partial region toward the first partial region crosses the first direction;
the second semiconductor layer comprises a third partial region and a fourth partial region;
the first partial region is provided between the third partial region and the first electrode in the first direction; and
the fourth partial region is provided between the second electrode and the second partial region in the first direction.

16. The element according to claim 15, further comprising:

a conductive portion electrically connected to the second electrode; and
an insulating portion; wherein:
the first partial region is provided between the conductive portion and the first electrode in the first direction;
the third partial region is provided between the conductive portion and the first partial region in the first direction;
the insulating portion is provided between the conductive portion and the third partial region in the first direction;
the fourth partial region is provided between the conductive portion and the second partial region in the first direction; and
the second electrode is provided between the conductive portion and the fourth partial region in the first direction.

17. A method for manufacturing a light-emitting element, the method comprising:

a preparing step comprising preparing a semiconductor stacked body, the semiconductor stacked body comprising a first semiconductor layer, a second semiconductor layer, and a light-emitting layer located between the first semiconductor layer and the second semiconductor layer, the first semiconductor layer comprising gallium and nitrogen and being of an n-type, the second semiconductor layer comprising gallium and nitrogen and being of a p-type;

a first exposing step comprising exposing at least a side surface of the first semiconductor layer by removing a portion of the first semiconductor layer, a portion of the second semiconductor layer, and a portion of the light-emitting layer;

a first introducing step comprising introducing oxygen to a portion of the semiconductor stacked body including the side surface by processing, in an atmosphere including oxygen, the semiconductor stacked body after the first exposing; and a forming step comprising forming an unevenness in a surface of the first semiconductor layer;

wherein the first introducing step is performed between the first exposing step and the forming step.

18. The method according to claim 17, further comprising:
a bonding step comprising bonding a support body and the semiconductor stacked body; and
a removing step comprising removing a substrate; wherein:
the semiconductor stacked body is formed on the substrate in the preparing step;
the removing step is performed after the bonding step; and
the first exposing step and the first introducing step are performed after the removing step.

* * * * *